(12) United States Patent
Kim et al.

(10) Patent No.: US 7,528,750 B2
(45) Date of Patent: May 5, 2009

(54) ENTROPY ENCODING AND DECODING APPARATUS AND METHOD BASED ON TREE STRUCTURE

(75) Inventors: Jung-hoe Kim, Seoul (KR); Anton Porov, Yongin-si (KR); Eun-mi Oh, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/957,589

(22) Filed: Dec. 17, 2007

(65) Prior Publication Data

US 2008/0218390 A1 Sep. 11, 2008

(30) Foreign Application Priority Data

Mar. 8, 2007 (KR) .................. 10-2007-0023168

(51) Int. Cl.
*H93M 7/00* (2006.01)

(52) U.S. Cl. ........................................ 341/107; 341/50

(58) Field of Classification Search ............ 341/50–110
See application file for complete search history.

(56) References Cited

U.S. PATENT DOCUMENTS

| 6,104,324 | A * | 8/2000 | Kim ........................... 341/58 |
| 6,744,925 | B2 * | 6/2004 | Kimura et al. .............. 382/238 |
| 7,265,692 | B2 * | 9/2007 | Martin et al. ............... 341/107 |
| 2002/0037111 | A1 | 3/2002 | Kimura et al. |
| 2003/0202710 | A1 | 10/2003 | Cheung et al. |
| 2007/0046504 | A1 | 3/2007 | Ridge et al. |

OTHER PUBLICATIONS

International Search Report dated May 19, 2008 issued in PCT/KR2008/1187.

* cited by examiner

*Primary Examiner*—Lam T Mai
(74) *Attorney, Agent, or Firm*—Stanzione & Kim, LLP

(57) ABSTRACT

Encoding and decoding of an audio signal or a video signal. By performing entropy encoding and decoding based on a tree structure, coding efficiency is increased, complexity is reduced, and additional information can be reduced.

69 Claims, 14 Drawing Sheets

ENTROPY ENCODING AND DECODING APPARATUS AND METHOD BASED ON TREE STRUCTURE

CROSS-REFERENCE TO RELATED APPLICATIONS

This application claims priority under 35 U.S.C. §119(a) from Korean Patent Application No. 10-2007-0023168, filed on Mar. 8, 2007, in the Korean Intellectual Property Office, the disclosure of which is incorporated herein in its entirety by reference.

BACKGROUND OF THE INVENTION

1. Field of the Invention

The present general inventive concept relates to encoding and decoding of an audio signal or a video signal, and more particularly, to entropy encoding and decoding.

2. Description of the Related Art

When an audio signal or a video signal is encoded, an input signal is processed in a predetermined method, quantized, and entropy-encoded. Alternatively, when an audio signal or a video signal is decoded, a bitstream generated by an encoder is processed in a predetermined method, entropy-decoded, and dequantized.

If the entropy encoding and the entropy decoding are performed according to the prior art, coding efficiency is low and complexity is high. For example, in the case of Advanced Audio Coding (AAC), since additional information, such as "section_data", of an entropy coding output range, an amount of additional data in coding increases. For example, in order to encode a signal having the size of 1024, 1024 codebooks are needed, requiring much memory space and considerable complexity.

SUMMARY OF THE INVENTION

The present general inventive concept provides an apparatus and method to perform entropy encoding and decoding based on a tree structure.

Additional aspects and utilities of the present general inventive concept will be set forth in part in the description which follows and, in part, will be obvious from the description, or may be learned by practice of the general inventive concept.

The foregoing and/or other aspects and utilities of the general inventive concept may be achieved by providing an entropy encoding apparatus including a codeword detector to detect a codeword corresponding to a specific symbol from among stored codewords, each stored codeword corresponding to predetermined grouped symbols, a probability detector to detect a probability value corresponding to each code of the detected codeword based on a tree structure in which an existence probability of each code is assigned to each node, a difference calculator to calculate a difference between a representative value indicated by the detected codeword and a value indicated by the specific symbol and to calculate a probability of detecting the specific symbol from among symbols contained in the detected codeword, and an arithmetic encoder to arithmetically encode the detected codeword and the calculated difference using the calculated probabilities.

The foregoing and/or other aspects and utilities of the general inventive concept may also be achieved by providing an entropy encoding apparatus including a codeword detector to detect a codeword corresponding to a specific symbol from among stored codewords, each stored codeword corresponding to predetermined grouped symbols, a selector to select a predetermined tree structure from among a plurality of tree structures in which an existence probability of each code is differently assigned to each node, based on a context of previous symbols, a probability detector to detect a probability value corresponding to each code of the detected codeword based on the selected tree structure, a difference calculator to calculate a difference between a representative value indicated by the detected codeword and a value indicated by the specific symbol and to calculate a probability of detecting the specific symbol from among symbols contained in the detected codeword, and an arithmetic encoder to arithmetically encode the detected codeword and the calculated difference using the calculated probabilities.

The foregoing and/or other aspects and utilities of the general inventive concept may also be achieved by providing an entropy encoding apparatus including a codeword detector to detect a codeword corresponding to a specific symbol from among stored codewords, each stored codeword corresponding to predetermined grouped symbols, a selector to select a predetermined tree structure from among a plurality of different tree structures in which an existence probability of each code is assigned to each node, based on a context of previous symbols, a probability detector to detect a probability value corresponding to each code of the detected codeword based on the selected tree structure, a difference calculator to calculate a difference between a representative value indicated by the detected codeword and a value indicated by the specific symbol and to calculate a probability of detecting the specific symbol from among symbols contained in the detected codeword, and an arithmetic encoder to arithmetically encode the detected codeword and the calculated difference using the calculated probabilities.

The foregoing and/or other aspects and utilities of the general inventive concept may also be achieved by providing an entropy decoding apparatus including a codeword detector to detect a codeword by performing arithmetic-decoding based on a tree structure in which an existence probability of each code is assigned to each node, a difference detector to detect a difference between a representative value indicated by the detected codeword and a value indicated by a symbol specified in an encoding end by performing arithmetic-decoding, and a symbol detector to detect the specified symbol from among symbols grouped corresponding to the detected codeword using the detected difference.

The foregoing and/or other aspects and utilities of the general inventive concept may also be achieved by providing an entropy decoding apparatus including a tree structure determiner determining a tree structure used in an encoding end from among a plurality of tree structures in which an existence probability of each code is differently assigned to each node, a codeword detector to detect a codeword by arithmetic-decoding a bitstream based on the determined tree structure, a difference detector to detect a difference between a representative value indicated by the detected codeword and a value indicated by a symbol specified in an encoding end by performing arithmetic-decoding, and a symbol detector to detect the specified symbol from among symbols grouped corresponding to the detected codeword using the detected difference.

The foregoing and/or other aspects and utilities of the general inventive concept may also be achieved by providing an entropy decoding apparatus including a tree structure determiner to determine a tree structure used in an encoding end from among a plurality of different tree structures in which an existence probability of each code is assigned to each node, a codeword detector to detect a codeword by performing arithmetic-decoding based on the determined tree structure, a difference detector to detect a difference between a representative value indicated by the detected codeword and a value indicated by a symbol specified in an encoding end by performing arithmetic-decoding, and a symbol detector to detect the specified symbol from among symbols grouped corresponding to the detected codeword using the detected difference.

The foregoing and/or other aspects and utilities of the general inventive concept may also be achieved by providing an entropy encoding method including detecting a codeword corresponding to a specific symbol from among stored codewords, each stored codeword corresponding to predetermined grouped symbols, detecting a probability value corresponding to each code of the detected codeword based on a tree structure in which an existence probability of each code is assigned to each node, calculating a difference between a representative value indicated by the detected codeword and a value indicated by the specific symbol and calculating a probability of detecting the specific symbol from among symbols contained in the detected codeword, and arithmetically encoding the detected codeword and the calculated difference using the calculated probabilities.

The foregoing and/or other aspects and utilities of the general inventive concept may also be achieved by providing an entropy encoding method including detecting a codeword corresponding to a specific symbol from among stored codewords, each stored codeword corresponding to predetermined grouped symbols, selecting a predetermined tree structure from among a plurality of tree structures in which an existence probability of each code is differently assigned to each node, based on a context of previous symbols, detecting a probability value corresponding to each code of the detected codeword based on the selected tree structure, calculating a difference between a representative value indicated by the detected codeword and a value indicated by the specific symbol and calculating a probability of detecting the specific symbol from among symbols contained in the detected codeword, and arithmetically encoding the detected codeword and the calculated difference using the calculated probabilities.

The foregoing and/or other aspects and utilities of the general inventive concept may also be achieved by providing an entropy encoding method including detecting a codeword corresponding to a specific symbol from among stored codewords, each stored codeword corresponding to predetermined grouped symbols, selecting a predetermined tree structure from among a plurality of different tree structures in which an existence probability of each code is assigned to each node, based on a context of previous symbols, detecting a probability value corresponding to each code of the detected codeword based on the selected tree structure, calculating a difference between a representative value indicated by the detected codeword and a value indicated by the specific symbol and calculating a probability of detecting the specific symbol from among symbols contained in the detected codeword, and arithmetically encoding the detected codeword and the calculated difference using the calculated probabilities.

The foregoing and/or other aspects and utilities of the general inventive concept may also be achieved by providing an entropy decoding method including detecting a codeword by performing arithmetic-decoding based on a tree structure in which an existence probability of each code is assigned to each node, detecting a difference between a representative value indicated by the detected codeword and a value indicated by a symbol specified in an encoding end by performing arithmetic-decoding, and detecting the specified symbol from among symbols grouped corresponding to the detected codeword using the detected difference.

The foregoing and/or other aspects and utilities of the general inventive concept may also be achieved by providing an entropy decoding method including determining a tree structure used in an encoding end from among a plurality of tree structures in which an existence probability of each code is differently assigned to each node, detecting a codeword by arithmetic-decoding a bitstream based on the determined tree structure, detecting a difference between a representative value indicated by the detected codeword and a value indicated by a symbol specified in an encoding end by performing arithmetic-decoding, and detecting the specified symbol from among symbols grouped corresponding to the detected codeword using the detected difference.

The foregoing and/or other aspects and utilities of the general inventive concept may also be achieved by providing an entropy decoding method including determining a tree structure used in an encoding end from among a plurality of different tree structures in which an existence probability of each code is assigned to each node, detecting a codeword by arithmetic-decoding a bitstream based on the determined tree structure, detecting a difference between a representative value indicated by the detected codeword and a value indicated by a symbol specified in an encoding end by performing arithmetic-decoding, and detecting the specified symbol from among symbols grouped corresponding to the detected codeword using the detected difference.

The foregoing and/or other aspects and utilities of the general inventive concept may also be achieved by providing a computer-readable recording medium having embodied thereon a computer program to execute a method, wherein the method includes detecting a codeword corresponding to a specific symbol from among stored codewords, each stored codeword corresponding to predetermined grouped symbols, detecting a probability value corresponding to each code of the detected codeword based on a tree structure in which an existence probability of each code is assigned to each node, calculating a difference between a representative value indicated by the detected codeword and a value indicated by the specific symbol and calculating a probability of detecting the specific symbol from among symbols contained in the detected codeword, and arithmetically encoding the detected codeword and the calculated difference using the calculated probabilities.

The foregoing and/or other aspects and utilities of the general inventive concept may also be achieved by providing a computer-readable recording medium having embodied thereon a computer program to execute a method, wherein the method includes detecting a codeword corresponding to a specific symbol from among stored codewords, each stored codeword corresponding to predetermined grouped symbols, selecting a predetermined tree structure from among a plurality of tree structures in which an existence probability of each code is differently assigned to each node, based on a context of previous symbols, detecting a probability value corresponding to each code of the detected codeword based on the selected tree structure, calculating a difference between a representative value indicated by the detected codeword and a value indicated by the specific symbol and calculating a probability of detecting the specific symbol from among symbols contained in the detected codeword, and arithmetically encoding the detected codeword and the calculated difference using the calculated probabilities.

The foregoing and/or other aspects and utilities of the general inventive concept may also be achieved by providing a computer-readable recording medium having embodied thereon a computer program to execute a method, wherein the method includes detecting a codeword corresponding to a specific symbol from among stored codewords, each stored codeword corresponding to predetermined grouped symbols, selecting a predetermined tree structure from among a plurality of different tree structures in which an existence probability of each code is assigned to each node, based on a context of previous symbols, detecting a probability value corresponding to each code of the detected codeword based on the selected tree structure, calculating a difference between a representative value indicated by the detected codeword and a value indicated by the specific symbol and calculating a probability of detecting the specific symbol from among symbols contained in the detected codeword, and arithmetically encoding the detected codeword and the calculated difference using the calculated probabilities.

The foregoing and/or other aspects and utilities of the general inventive concept may also be achieved by providing a computer-readable recording medium having a computer program to execute a method, wherein the method includes detecting a codeword by performing arithmetic-decoding based on a tree structure in which an existence probability of each code is assigned to each node, detecting a difference between a representative value indicated by the detected codeword and a value indicated by a symbol specified in an encoding end by performing arithmetic-decoding, and detecting the specified symbol from among symbols grouped corresponding to the detected codeword using the detected difference.

The foregoing and/or other aspects and utilities of the general inventive concept may also be achieved by providing a computer-readable recording medium having embodied thereon a computer program to execute a method, wherein the method includes determining a tree structure used in an encoding end from among a plurality of tree structures in which an existence probability of each code is differently assigned to each node, detecting a codeword by arithmetic-decoding a bitstream based on the determined tree structure, detecting a difference between a representative value indicated by the detected codeword and a value indicated by a symbol specified in an encoding end by performing arithmetic-decoding, and detecting the specified symbol from among symbols grouped corresponding to the detected codeword using the detected difference.

The foregoing and/or other aspects and utilities of the general inventive concept may also be achieved by providing a computer-readable recording medium having embodied thereon a computer program to execute a method, wherein the method includes determining a tree structure used in an encoding end from among a plurality of different tree structures in which an existence probability of each code is assigned to each node, detecting a codeword by arithmetic-decoding a bitstream based on the determined tree structure, detecting a difference between a representative value indicated by the detected codeword and a value indicated by a symbol specified in an encoding end by performing arithmetic-decoding, and detecting the specified symbol from among symbols grouped corresponding to the detected codeword using the detected difference.

The foregoing and/or other aspects and utilities of the general inventive concept may also be achieved by providing an entropy encoding apparatus, including a codeword detector to detect a codeword corresponding to a respective symbol from one or more stored codewords, each stored codeword corresponding to predetermined grouped symbols, and a probability detector to detect a probability value corresponding to each code of the detected codeword based on at least one predetermined tree structure in which an existence probability of each code is assigned to each node.

The foregoing and/or other aspects and utilities of the general inventive concept may also be achieved by providing an entropy decoding apparatus, including a tree structure determiner to determine a tree structure used to encode a signal from one or more tree structures in which an existence probability of each code is differently assigned to each node, and a codeword detector to detect a codeword by arithmetic-decoding a bitstream based on the determined tree structure.

The foregoing and/or other aspects and utilities of the general inventive concept may also be achieved by providing a method of encoding a signal, the method including detecting a codeword corresponding to a respective symbol from one or more stored codewords in which each stored codeword corresponds to predetermined grouped symbols, and detecting a probability value corresponding to each code of the detected codeword based on at least one predetermined tree structure in which an existence probability of each code is assigned to each node.

The foregoing and/or other aspects and utilities of the general inventive concept may also be achieved by providing a method of decoding a signal, the method including determining a tree structure used to encode a signal from one or more tree structures in which an existence probability of each code is differently assigned to each node, and detecting a codeword by arithmetic-decoding a bitstream based on the determined tree structure.

BRIEF DESCRIPTION OF THE DRAWINGS

These and/or other aspects and utilities of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
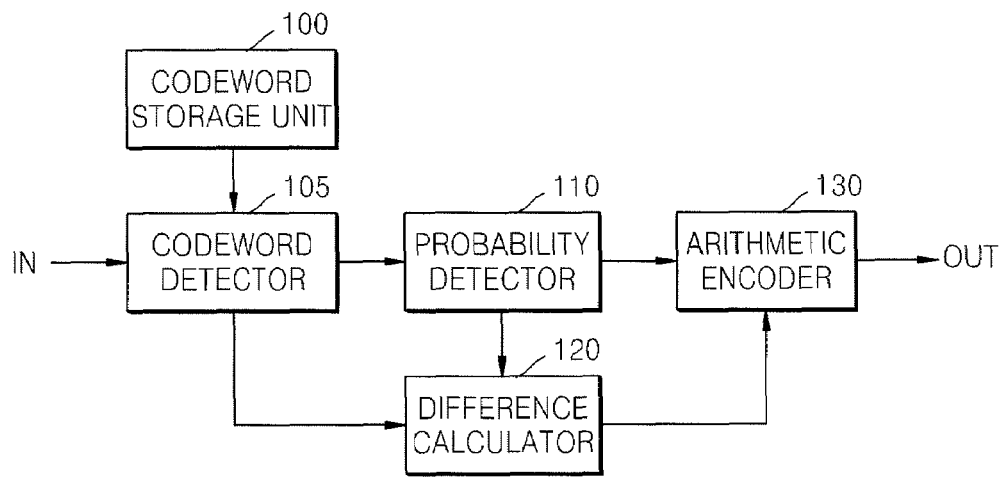
FIG. 1 is a block diagram illustrating an entropy encoding apparatus based on a tree structure according to an embodiment of the present general inventive concept.

Hereinafter, the present general inventive concept will now be described in detail by explaining preferred embodiments of the general inventive concept with reference to the attached drawings.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

FIG. 1 is a block diagram illustrating an entropy encoding apparatus based on a tree structure according to an embodiment of the present general inventive concept. Referring to FIG. 1, the entropy encoding apparatus includes a codeword storage unit 100, a codeword detector 105, a probability detector 110, a difference calculator 120, and an arithmetic encoder 130.

The codeword storage unit 100 groups predetermined symbols and stores a predetermined codeword corresponding to each group.

Figure 4:
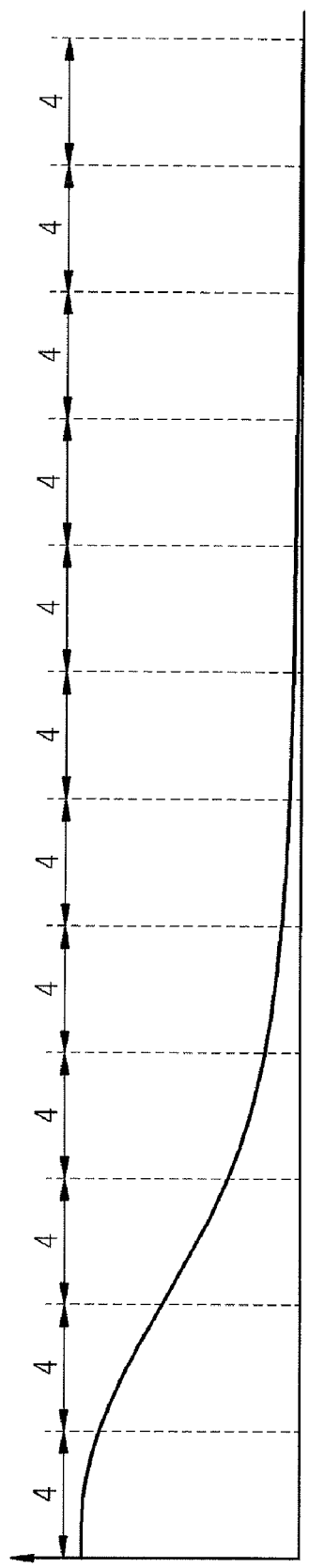
FIG. 4 illustrates that symbols are grouped with a uniform spacing.

When the codeword storage unit 100 groups symbols, the codeword storage unit 100 can group the symbols with a uniform spacing. FIG. 4 illustrates an illustration that symbols are grouped with the uniform spacing. In FIG. 4, symbols are grouped corresponding to each codeword {2, 0, 1, 3, 15, 7, 31, 63, 23, 127, 55, 255} with the uniform spacing of 4.

Figure 5:
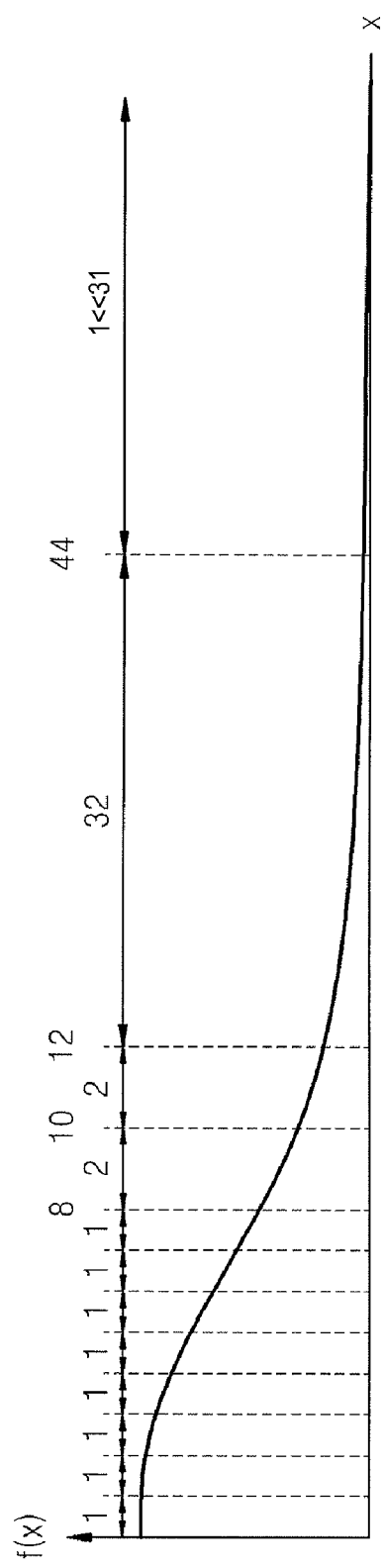
FIG. 5 illustrates that symbols are grouped with a non-uniform spacing.

Alternatively, when the codeword storage unit 100 groups symbols, the codeword storage unit 100 can group the symbols with a non-uniform spacing. FIG. 5 illustrates an illustration that symbols are grouped with the non-uniform spacing. In FIG. 5, symbols are grouped corresponding to each codeword {2, 0, 1, 3, 15, 7, 31, 63, 23, 127, 55, 255} with the non-uniform spacing of {1, 1, 1, 1, 1, 1, 1, 1, 2, 2, 32, 1<<31}. Accordingly, a length of each codeword is {2, 2, 2, 3, 5, 5, 6, 7, 6, 8, 6, 8}, a starting symbol of symbols contained in a symbol group of each codeword is {0, 1, 2, 3, 4, 5, 6, 7, 8, 10, 12, 44}, and a probability assigned to each codeword is {4973, 5684, 2580, 1243, 675, 387, 236, 158, 183, 99, 162, 3}. Here, the spacing of 1<<31 may represent a spacing varying between 1 and 31.

When the codeword storage unit 100 groups symbols with the non-uniform spacing, symbols contained in a duration in which probabilities significantly vary are grouped with a wide spacing, and symbols contained in a duration in which probabilities insignificantly vary are grouped with a narrow spacing. For example, symbols of which a slope of a Probability Density Function (PDF) is within a pre-set range can be grouped together. In FIG. 5, while the spacing is set to 1 for each of durations 0 through 8 in which probabilities significantly vary, the spacing is set to 2 for each of durations 8 through 12 in which probabilities more significantly vary, and the spacing is set to 32 and 1<<31 for durations 12 and more in which probabilities much more significantly vary.

The codeword detector 105 receives a quantized symbol via an input terminal IN, searches a codeword corresponding to the quantized symbol from the codeword storage unit 100, and outputs the found codeword. As an example of FIG. 5, when a quantized symbol '10' is received via the input terminal IN, the codeword detector 105 detects a codeword '127' corresponding to the quantized symbol '10' from the codeword storage unit 100.

Figure 6:
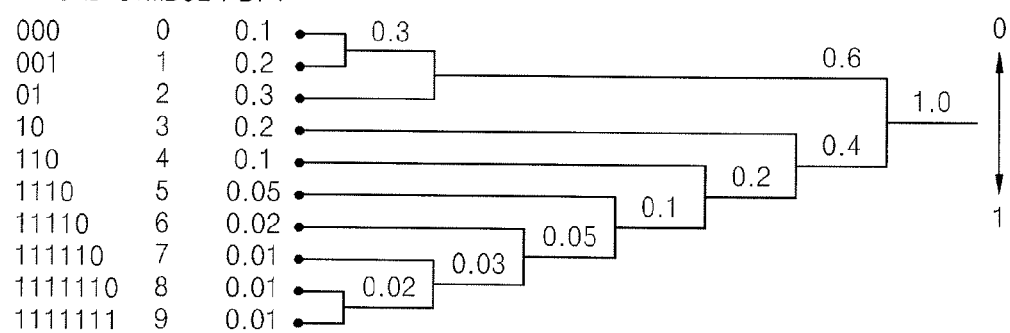
FIG. 6 illustrates a conceptual diagram of a tree structure.

The probability detector 110 detects a probability of extracting each code of the codeword detected by the codeword detector 105 based on a tree structure in which an existence probability of each code is assigned to each node. The tree structure has a plurality of nodes, each node having a pre-set probability of extracting code '0' and a pre-set probability of extracting code '1'. For example, as illustrated in FIG. 6, in each node, a probability of extracting code '0' is assigned in the upper direction, and a probability of extracting code '1' is assigned in the lower direction.

The probability detector 110 can calculate the probability of extracting each code of the detected codeword using a probability of extracting a code assigned to each node in the tree structure as represented by Equations 1 and 2.

$$p_i(0) = \frac{p_{i-1}(0)}{p_{i-1}(0) + p_{i-1}(1)} \tag{1}$$

Here, $p_i(x)$ denotes a probability of extracting x in an $i^{th}$ node.

$$p_i(1) = \frac{p_{i-1}(1)}{p_{i-1}(0) + p_{i-1}(1)} \tag{2}$$

Here, $p_i(x)$ denotes a probability of extracting x in an $i^{th}$ node.

As an example of FIG. 6, when a codeword '110' is detected by the codeword detector 105, a probability of extracting the first code '1' is detected as $p_1(1)=0.4$ by use of the tree structure illustrated in FIG. 6. A probability of extracting the second code '1' existing next to the first code is calculated using Equation 3.

$$p_2(1) = \frac{p_1(1)}{p_1(0) + p_1(1)} = \frac{0.2}{0.4} = 0.5 \tag{3}$$

A probability of extracting the third code '0' existing next to the codes '11' is calculated using Equation 4.

$$p_3(0) = \frac{p_2(0)}{p_2(0) + p_2(1)} = \frac{0.1}{0.2} = 0.5 \tag{4}$$

Thus, when the codeword detector 105 detects the codeword '110', the probability detector 110 detects {$p_1(1), p_2(1), p_3(0)$}={0.4, 0.5, 0.5}.

The difference calculator 120 calculates a difference between a representative value indicated by the codeword detected by the codeword detector 105 and a value indicated by the quantized symbol input via the input terminal IN. The representative value indicated by the codeword is a value pre-set to the codeword to be representative of symbols contained in the codeword according to a predetermined condition, such as the smallest value or a mean value of the symbols contained in the codeword.

The difference calculator 120 also calculates a probability of detecting the quantized symbol input via the input terminal IN from among the symbols contained in the codeword detected by the codeword detector 105. When symbols are grouped with the uniform spacing as illustrated in FIG. 4, the probability of detecting the quantized symbol is a value calculated by setting the length of the uniform spacing to 1. Alternatively, when symbols are grouped with the non-uniform spacing as illustrated in FIG. 5, the probability of detecting the quantized symbol is a value calculated by setting the length of a spacing of a group to which the quantized symbol belongs to 1.

The arithmetic encoder 130 generates a bitstream by arithmetic-encoding the codeword detected by the codeword detector 105 and the difference between the representative value indicated by the detected codeword and the value indicated by the quantized symbol, which was calculated by the difference calculator 120, using the probability of extracting each code of the detected codeword, which was detected by the probability detector 110, and the probability of detecting the quantized symbol in a relevant duration, which was calculated by the difference calculator 120, and outputs the generated bitstream via an output terminal OUT.

Figure 2:
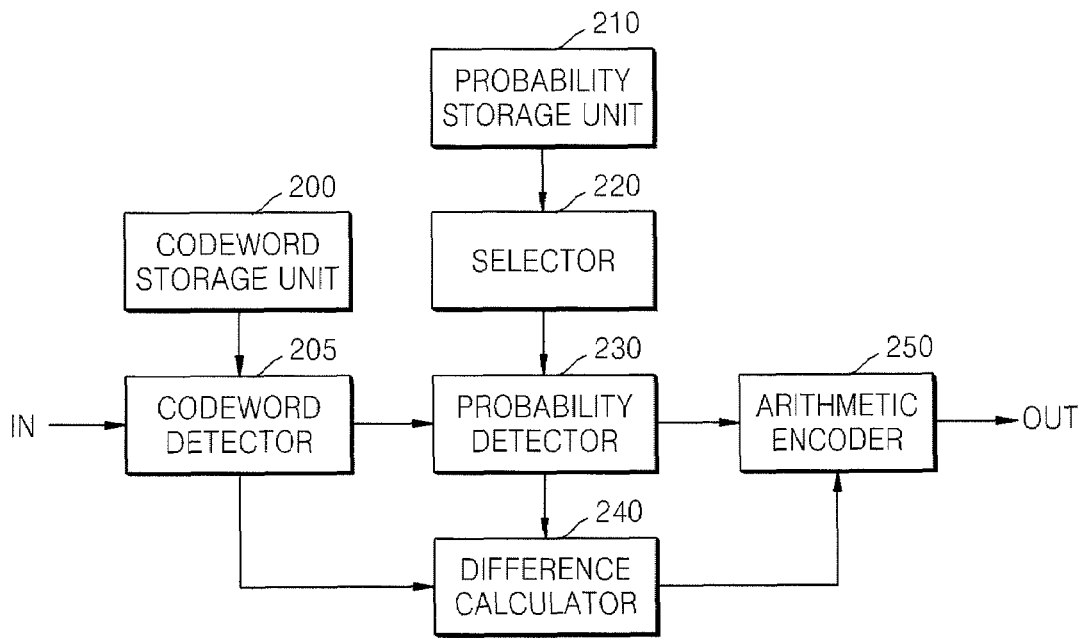
FIG. 2 is a block diagram illustrating an entropy encoding apparatus based on a tree structure according to another embodiment of the present general inventive concept.

FIG. 2 is a block diagram illustrating an entropy encoding apparatus based on a tree structure according to another embodiment of the present general inventive concept. Referring to FIG. 2, the entropy encoding apparatus includes a codeword storage unit 200, a codeword detector 205, a probability storage unit 210, a selector 220, a probability detector 230, a difference calculator 240, and an arithmetic encoder 250.

The codeword storage unit 200 groups predetermined symbols and stores a predetermined codeword corresponding to each group.

When the codeword storage unit 200 groups symbols, the codeword storage unit 200 can group the symbols with a uniform spacing. FIG. 4 illustrates an illustration that symbols are grouped with the uniform spacing. In FIG. 4, symbols are grouped corresponding to each codeword {2, 0, 1, 3, 15, 7, 31, 63, 23, 127, 55, 255} with the uniform spacing of 4.

Alternatively, when the codeword storage unit 200 groups symbols, the codeword storage unit 200 can group the symbols with a non-uniform spacing. FIG. 5 illustrates an illustration that symbols are grouped with the non-uniform spacing. In FIG. 5, symbols are grouped corresponding to each codeword {2, 0, 1, 3, 15, 7, 31, 63, 23, 127, 55, 255} with non-uniform spacing of {1, 1, 1, 1, 1, 1, 1, 1, 2, 2, 32, 1<<31}. Accordingly, a length of each codeword is {2, 2, 2, 3, 5, 5, 6, 7, 6, 8, 6, 8}, a starting symbol of symbols contained in a symbol group of each codeword is {0, 1, 2, 3, 4, 5, 6, 7, 8, 10, 12, 44}, and a probability assigned to each codeword is {4973, 5684, 2580, 1243, 675, 387, 236, 158, 183, 99, 162, 3}.

When the codeword storage unit 200 groups symbols with the non-uniform spacing, symbols contained in a duration in which probabilities significantly vary are grouped with a wide spacing, and symbols contained in a duration in which probabilities insignificantly vary are grouped with a narrow spacing. For example, symbols of which a slope of a PDF is within a pre-set range can be grouped together. In FIG. 5, while the spacing is set to 1 for each of durations 0 through 8 in which probabilities significantly vary, the spacing is set to 2 for each of durations 8 through 12 in which probabilities more significantly vary, and the spacing is set to 32 and 1<<31 for durations 12 and more in which probabilities much more significantly vary.

The codeword detector 205 receives a quantized symbol via an input terminal IN, searches a codeword corresponding to the quantized symbol from the codeword storage unit 100, and outputs the found codeword. As an example of FIG. 5, when a quantized symbol '10' is received via the input terminal IN, the codeword detector 205 detects a codeword '127' corresponding to the quantized symbol '10' from the codeword storage unit 200.

The probability storage unit 210 stores a plurality of tree structures having the same structure, wherein an existence probability of each code is differently assigned to each node according to the plurality of tree structures. Accordingly, the plurality of tree structures stored in the probability storage unit 210 have the same structure in which only the existence probability of each code is differently assigned to each node.

Figure 7:
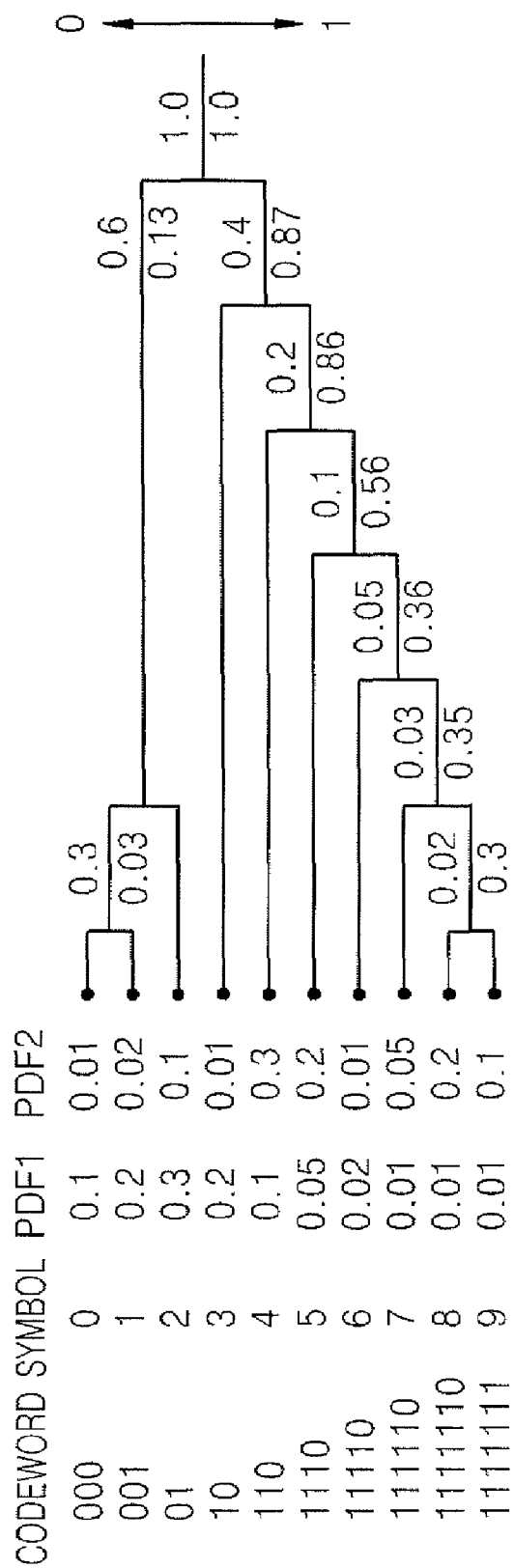
FIG. 7 illustrates a conceptual diagram of a plurality of tree structures.

The tree structure has a plurality of nodes, each node having a pre-set probability of extracting code '0' and a pre-set probability of extracting code '1'. For example, as illustrated in FIG. 7, in each node, a probability of extracting code '0' is assigned in the upper direction, and a probability of extracting code '1' is assigned in the lower direction. In FIG. 7, PDF1 and PDF2 having the same tree structure in which an existence probability of each code is differently assigned to each node are stored.

The selector 220 selects a predetermined tree structure from among the plurality of tree structures stored in the probability storage unit 210 by analyzing a context of previously quantized symbols.

When the selector 220 analyzes the context of the previously quantized symbols, the predetermined tree structure can be selected by analyzing the context of quantized symbols of a previous frame and then analyzing a context of quantized symbols of a current frame. If data of the previous frame does not exist, the predetermined tree structure can be selected by analyzing only the context of the quantized symbols of the current frame.

Figure 8A:
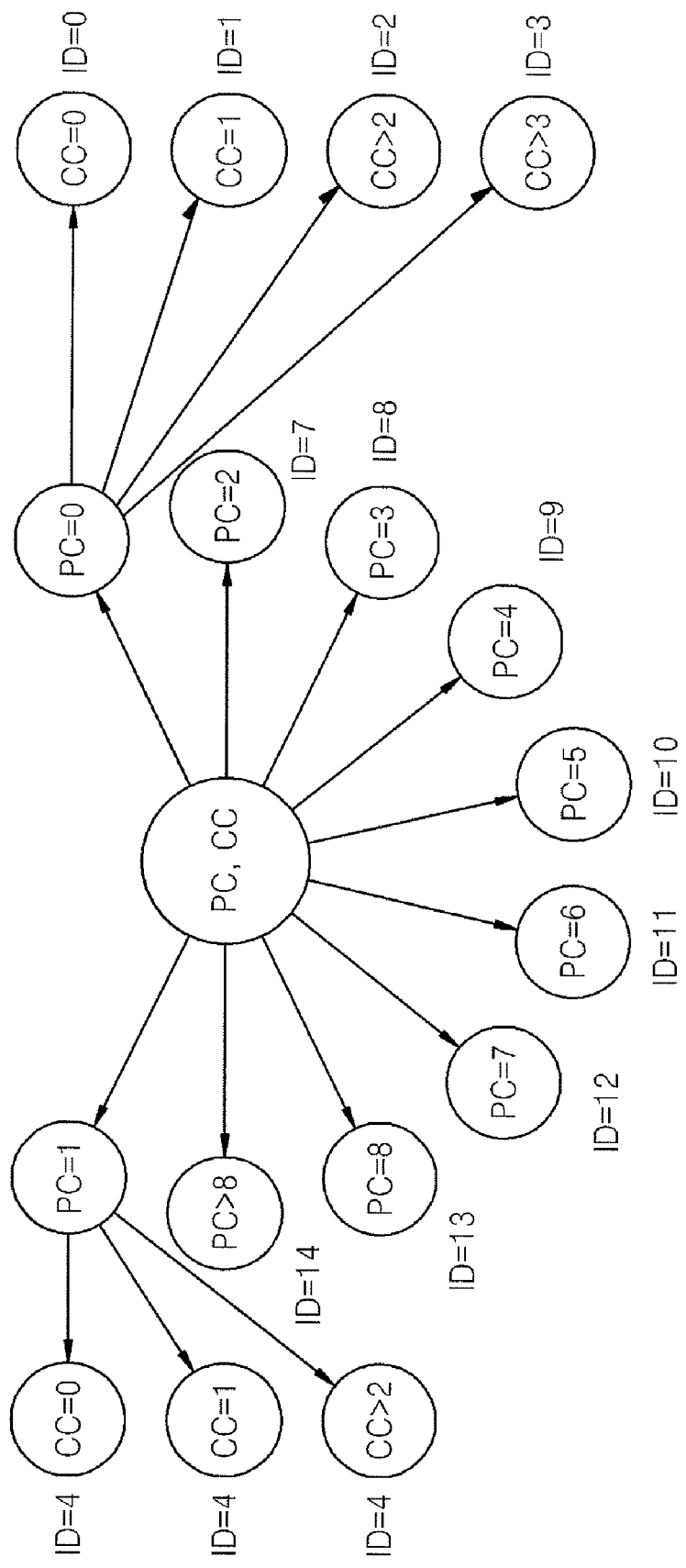
FIG. 8A illustrates a conceptual diagram of selecting a tree structure based on a context of a previous frame and a context of a current frame.
Figure 8B:
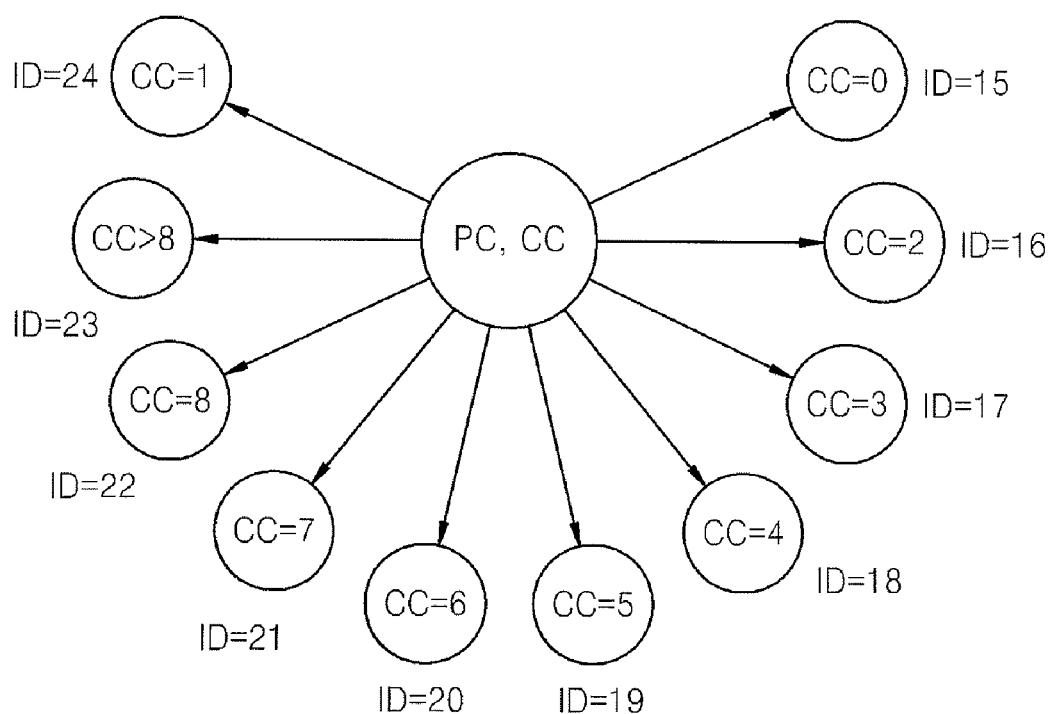
FIG. 8B illustrates a conceptual diagram of selecting a tree structure based on a context of a current frame.

FIG. 8A illustrates a conceptual diagram of selecting a tree structure by analyzing a context of a previous frame and a context of a current frame in the selector 220. In FIG. 8A, PC denotes a value corresponding to the context of the previous frame, CC denotes a value corresponding to the context of the current frame, and ID denotes an identification number of each tree structure stored in the probability storage unit 210. If the selector 220 detects that PC=0 and CC=1, the selector 220 selects a tree structure having ID '1' from among the plurality of tree structures stored in the probability storage unit 210. However, if data of the previous frame does not exist, the selector 220 selects a predetermined tree structure from the probability storage unit 210 using only CC, which is a value of the context of the current frame, as illustrated in FIG. 8B.

The probability detector 230 detects a probability of extracting each code of the codeword detected by the codeword detector 205 using the tree structure selected by the selector 220.

The probability detector 230 can calculate the probability of extracting each code of the detected codeword using a probability of extracting a code assigned to each node in the selected tree structure as represented by Equations 5 and 6.

$$p_i(0) = \frac{p_{i-1}(0)}{p_{i-1}(0) + p_{i-1}(1)} \quad (5)$$

Here, $p_i(x)$ denotes a probability of extracting x in an $i^{th}$ node.

$$p_i(1) = \frac{p_{i-1}(1)}{p_{i-1}(0) + p_{i-1}(1)} \quad (6)$$

Here, $p_i(x)$ denotes a probability of extracting x in an $i^{th}$ node.

As an example of FIG. 7, when a codeword '110' is detected by the codeword detector 205, and when a tree structure corresponding to PDF1 is selected by the selector 220, a probability of extracting the first code '1' is detected as $p_1(1)=0.4$ by use of the tree structure illustrated in FIG. 7. A probability of extracting the second code '1' existing next to the first code is calculated using Equation 7.

$$p_2(1) = \frac{p_1(1)}{p_1(0) + p_1(1)} = \frac{0.2}{0.4} = 0.5 \quad (7)$$

A probability of extracting the third code '0' existing next to the codes '11' is calculated using Equation 8.

$$p_3(0) = \frac{p_2(0)}{p_2(0) + p_2(1)} = \frac{0.1}{0.2} = 0.5 \quad (8)$$

Thus, when the codeword detector 205 detects the codeword '110', the probability detector 230 detects $\{p_1(1), p_2(1), p_3(0)\}=\{0.4, 0.5, 0.5\}$.

However, when the codeword '110' is detected by the codeword detector 205, and when a tree structure corresponding to PDF2 is selected by the selector 220, a probability of extracting the first code '1' is detected as $p_1(1)=0.87$ by use of the tree structure illustrated in FIG. 7. A probability of extracting the second code '1' existing next to the first code is calculated using Equation 9.

$$p_2(1) = \frac{p_1(1)}{p_1(0) + p_1(1)} = \frac{0.86}{0.87} = 0.99 \quad (9)$$

A probability of extracting the third code '0' existing next to the codes '11' is calculated using Equation 10.

$$p_3(0) = \frac{p_2(0)}{p_2(0) + p_2(1)} = \frac{0.3}{0.99} = 0.30 \quad (10)$$

Thus, when the codeword detector 205 detects the codeword '110', the probability detector 230 detects $\{p_1(1), p_2(1), p_3(0)\}=\{0.87, 0.99, 0.30\}$.

Thus, even when the codeword detector 205 detects the same codeword '110' and the probability storage unit 210 stores the same tree structures, since different probabilities are assigned to each node, the probability detector 230 outputs $\{p_1(1), p_2(1), p_3(0)\}=\{0.4, 0.5, 0.5\}$ if the selector 220 selects the tree structure corresponding to PDF1, whereas the probability detector 230 outputs $\{p_1(1), p_2(1), p_3(0)\}=\{0.87, 0.99, 0.30\}$ if the selector 220 selects the tree structure corresponding to PDF2.

The difference calculator 240 calculates a difference between a representative value indicated by the codeword detected by the codeword detector 205 and a value indicated by the quantized symbol input via the input terminal IN. The representative value indicated by the codeword is a value pre-set to the codeword to be representative of symbols contained in the codeword according to a predetermined condition, such as the smallest value or a mean value of the symbols contained in the codeword.

The difference calculator 240 also calculates a probability of detecting the quantized symbol input via the input terminal IN from among the symbols contained in the codeword detected by the codeword detector 205. When symbols are grouped with the uniform spacing as illustrated in FIG. 4, the probability of detecting the quantized symbol is a value calculated by setting the length of the uniform spacing to 1. Alternatively, when symbols are grouped with the non-uniform spacing as illustrated in FIG. 5, the probability of detecting the quantized symbol is a value calculated by setting the length of a spacing of a group to which the quantized symbol belongs to 1.

The arithmetic encoder 250 generates a bitstream by arithmetic-encoding the codeword detected by the codeword detector 205 and the difference between the representative value indicated by the detected codeword and the value indicated by the quantized symbol, which was calculated by the difference calculator 240, using the probability of extracting each code of the detected codeword, which was detected by the probability detector 230, and the probability of detecting the quantized symbol in a relevant duration, which was calculated by the difference calculator 240, and outputs the generated bitstream via an output terminal OUT.

Figure 3:
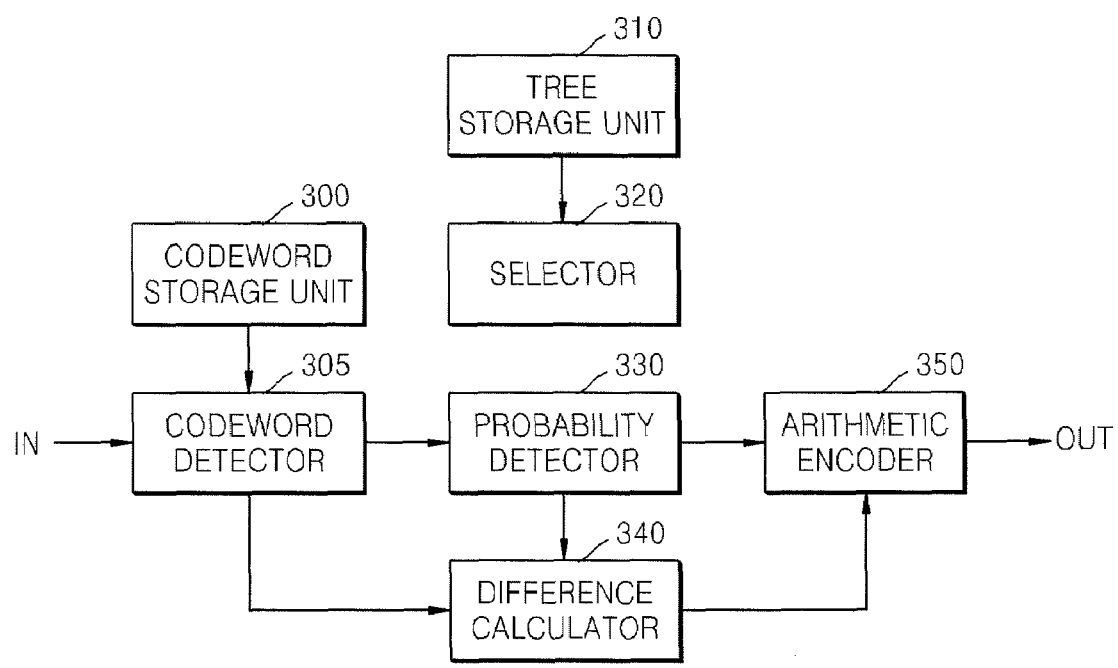
FIG. 3 is a block diagram illustrating an entropy encoding apparatus based on a tree structure according to another embodiment of the present general inventive concept.

FIG. 3 is a block diagram illustrating an entropy encoding apparatus based on a tree structure according to another embodiment of the present general inventive concept. Referring to FIG. 3, the entropy encoding apparatus includes a codeword storage unit 300, a codeword detector 305, a tree storage unit 310, a selector 320, a probability detector 330, a difference calculator 340, and an arithmetic encoder 350.

The codeword storage unit 300 groups predetermined symbols and stores a predetermined codeword corresponding to each group.

When the codeword storage unit 300 groups symbols, the codeword storage unit 300 can group the symbols with a uniform spacing. FIG. 4 illustrates an illustration that symbols are grouped with the uniform spacing. In FIG. 4, symbols are grouped corresponding to each codeword {2, 0, 1, 3, 15, 7, 31, 63, 23, 127, 55, 255} with the uniform spacing of 4.

Alternatively, when the codeword storage unit 300 groups symbols, the codeword storage unit 300 can group the symbols with a non-uniform spacing. FIG. 5 illustrates an illustration that symbols are grouped with the non-uniform spacing. In FIG. 5, symbols are grouped corresponding to each codeword {2, 0, 1, 3, 15, 7, 31, 63, 23, 127, 55, 255} with non-uniform spacing of {1, 1, 1, 1, 1, 1, 1, 1, 2, 2, 32, 1<<31}. Accordingly, the length of each codeword is {2, 2, 2, 3, 5, 5, 6, 7, 6, 8, 6, 8}, a starting symbol of symbols contained in a symbol group of each codeword is {0, 1, 2, 3, 4, 5, 6, 7, 8, 10, 12, 44}, and a probability assigned to each codeword is {4973, 5684, 2580, 1243, 675, 387, 236, 158, 183, 99, 162, 3}.

When the codeword storage unit 300 groups symbols with the non-uniform spacing, symbols contained in a duration in which probabilities significantly vary are grouped with a wide spacing, and symbols contained in a duration in which probabilities insignificantly vary are grouped with a narrow spacing. For example, symbols of which a slope of a PDF is within a pre-set range can be grouped together. In FIG. 5, while the spacing is set to 1 for each of durations 0 through 8 in which probabilities significantly vary, the spacing is set to 2 for each of durations 8 through 12 in which probabilities more significantly vary, and the spacing is set to 32 and 1<<31 for durations 12 and more in which probabilities much more significantly vary.

The codeword detector 305 receives a quantized symbol via an input terminal IN, searches a codeword corresponding to the quantized symbol from the codeword storage unit 300, and outputs the found codeword. As an example of FIG. 5, when a quantized symbol '10' is received via the input terminal IN, the codeword detector 305 detects a codeword '127' corresponding to the quantized symbol '10' from the codeword storage unit 300.

The tree storage unit 310 stores a plurality of different tree structures in which an existence probability of each code is assigned to each node. While the plurality of tree structures stored in the probability storage unit 210 of FIG. 2 have the same structure in which only the existence probability of each code is differently assigned to each node, the plurality of tree structures stored in the tree storage unit 310 are different from each other in their structure.

The selector 320 selects a predetermined tree structure from among the plurality of tree structures stored in the tree storage unit 310 by analyzing a context of previously quantized symbols.

When the selector 320 analyzes the context of the previously quantized symbols, the predetermined tree structure can be selected by analyzing the context of quantized symbols of a previous frame and then analyzing a context of quantized symbols of a current frame. If data of the previous frame does not exist, the predetermined tree structure can be selected by analyzing only the context of the quantized symbols of the current frame.

FIG. 8A illustrates a conceptual diagram illustrating selecting a tree structure by analyzing a context of a previous frame and a context of a current frame in the selector 320. In FIG. 8A, PC denotes a value corresponding to the context of the previous frame, CC denotes a value corresponding to the context of the current frame, and ID denotes an identification number of each tree structure stored in the tree storage unit 310. If the selector 320 detects that PC=0 and CC=1, the selector 320 selects a tree structure having ID '1' from among the plurality of tree structures stored in the tree storage unit 310. However, if data of the previous frame does not exist, the selector 320 selects a predetermined tree structure from the tree storage unit 310 using only CC, which is a value of the context of the current frame, as illustrated in FIG. 8B.

The probability detector 330 detects a probability of extracting each code of the codeword detected by the codeword detector 305 using the tree structure selected by the selector 320.

The probability detector 330 can calculate the probability of extracting each code of the detected codeword using a probability of extracting a code assigned to each node in the selected tree structure as represented by Equations 11 and 12.

$$p_i(0) = \frac{p_{i-1}(0)}{p_{i-1}(0) + p_{i-1}(1)} \quad (11)$$

Here, $p_i(x)$ denotes a probability of extracting x in an $i^{th}$ node.

$$p_i(1) = \frac{p_{i-1}(1)}{p_{i-1}(0) + p_{i-1}(1)} \quad (12)$$

Here, $p_i(x)$ denotes a probability of extracting x in an $i^{th}$ node.

The difference calculator 340 calculates a difference between a representative value indicated by the codeword detected by the codeword detector 305 and a value indicated by the quantized symbol input via the input terminal IN. The representative value indicated by the codeword is a value pre-set to the codeword to be representative of symbols contained in the codeword according to a predetermined condition, such as the smallest value or a mean value of the symbols contained in the codeword.

The difference calculator 340 also calculates a probability of detecting the quantized symbol input via the input terminal IN from among the symbols contained in the codeword detected by the codeword detector 305. When symbols are grouped with the uniform spacing as illustrated in FIG. 4, the probability of detecting the quantized symbol is a value calculated by setting the length of the uniform spacing to 1. Alternatively, when symbols are grouped with the non-uniform spacing as illustrated in FIG. 5, the probability of detecting the quantized symbol is a value calculated by setting the length of a spacing of a group to which the quantized symbol belongs to 1.

The arithmetic encoder 350 generates a bitstream by arithmetic-encoding the codeword detected by the codeword detector 305 and the difference between the representative value indicated by the detected codeword and the value indicated by the quantized symbol, which was calculated by the difference calculator 340, using the probability of extracting each code of the detected codeword, which was detected by the probability detector 330, and the probability of detecting the quantized symbol in a relevant duration, which was calculated by the difference calculator 340, and outputs the generated bitstream via an output terminal OUT.

Figure 9:
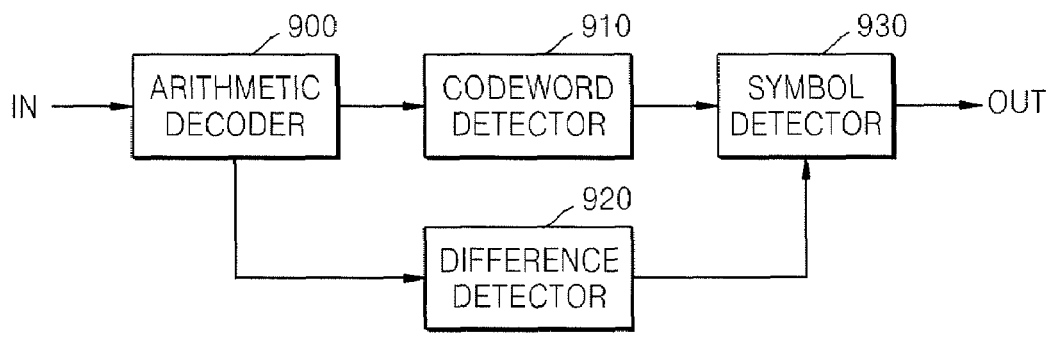
FIG. 9 is a block diagram illustrating an entropy decoding apparatus based on a tree structure according to an embodiment of the present general inventive concept.

FIG. 9 is a block diagram illustrating an entropy decoding apparatus based on a tree structure according to an embodiment of the present general inventive concept. Referring to FIG. 9, the entropy decoding apparatus includes an arithmetic decoder 900, a codeword detector 910, a difference detector 920, and a symbol detector 930.

The arithmetic decoder 900 receives a bitstream from an encoding end via an input terminal IN and performs arithmetic decoding of the bitstream.

The codeword detector 910 detects a codeword using a probability of detecting each code of the codeword, which is a result of the arithmetic decoding performed by the arithmetic decoder 900, based on a tree structure in which an existence probability of each code is assigned to each node.

The difference detector 920 detects a difference between a representative value indicated by the codeword detected by the codeword detector 910 and a value indicated by a symbol encoded in the encoding end using the result of the arithmetic decoding performed by the arithmetic decoder 900.

The symbol detector 930 detects a predetermined symbol from among symbols grouped corresponding to the codeword detected by the codeword detector 910 using the difference detected by the difference detector 920 and outputs the detected symbol via an output terminal OUT.

Figure 10:
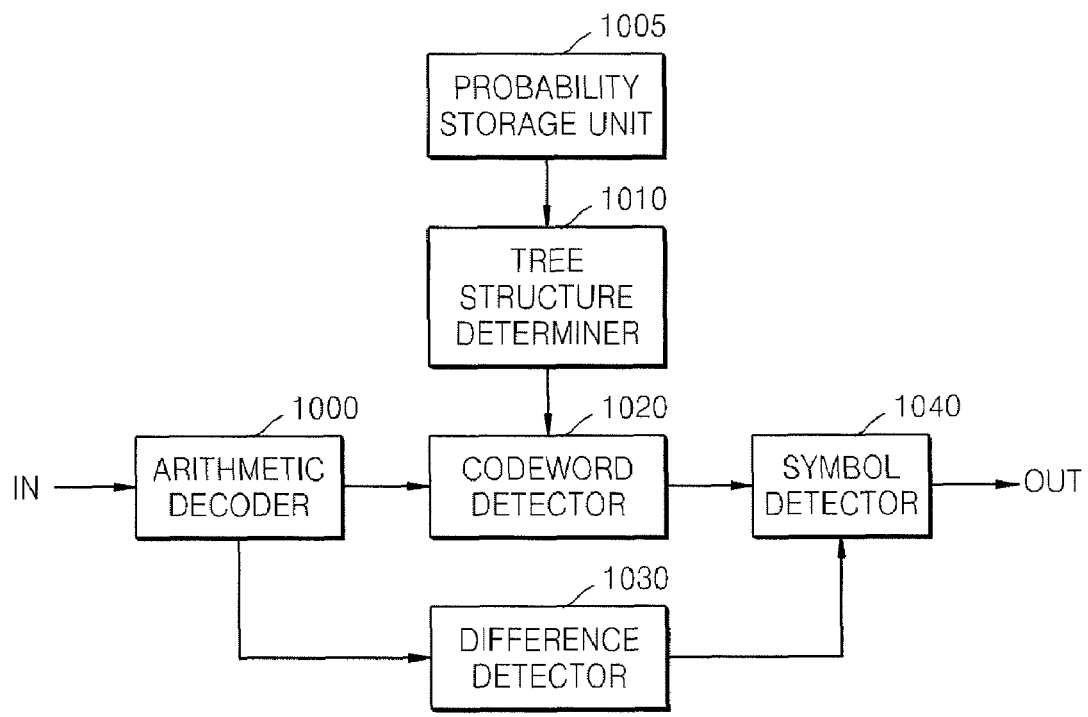
FIG. 10 is a block diagram illustrating an entropy decoding apparatus based on a tree structure according to another embodiment of the present general inventive concept.

FIG. 10 is a block diagram of an entropy decoding apparatus based on a tree structure according to another embodiment of the present general inventive concept. Referring to FIG. 10, the entropy decoding apparatus includes an arithmetic decoder 1000, a probability storage unit 1005, a tree structure determiner 1010, a codeword detector 1020, a difference detector 1030, and a symbol detector 1040.

The arithmetic decoder 1000 receives a bitstream from an encoding end via an input terminal IN and performs arithmetic decoding of the bitstream.

The probability storage unit 1005 stores a plurality of tree structures having the same structure, wherein an existence probability of each code is differently assigned to each node according to the plurality of tree structures. Accordingly, the plurality of tree structures stored in the probability storage unit 1005 have the same structure in which only the existence probability of each code is differently assigned to each node.

The tree structure determiner 1010 determines a tree structure used in the encoding end from among the plurality of tree structures stored in the probability storage unit 1005. As an example of a method of determining a tree structure in the tree structure determiner 1010, the tree structure determiner 1010 can determine the tree structure used in the encoding end by receiving an index indicating the tree structure used in the encoding end from the encoding end.

The codeword detector 1020 detects a codeword corresponding to a probability of detecting each code of the codeword, which is a result of the arithmetic decoding performed by the arithmetic decoder 1000, using the tree structure determined by the tree structure determiner 1010.

The difference detector 1030 detects a difference between a representative value indicated by the codeword detected by the codeword detector 1020 and a value indicated by a symbol encoded in the encoding end using the result of the arithmetic decoding performed by the arithmetic decoder 1000.

The symbol detector 1040 detects a predetermined symbol from among symbols grouped corresponding to the codeword detected by the codeword detector 1020 using the difference detected by the difference detector 1030 and outputs the detected symbol via an output terminal OUT.

Figure 11:
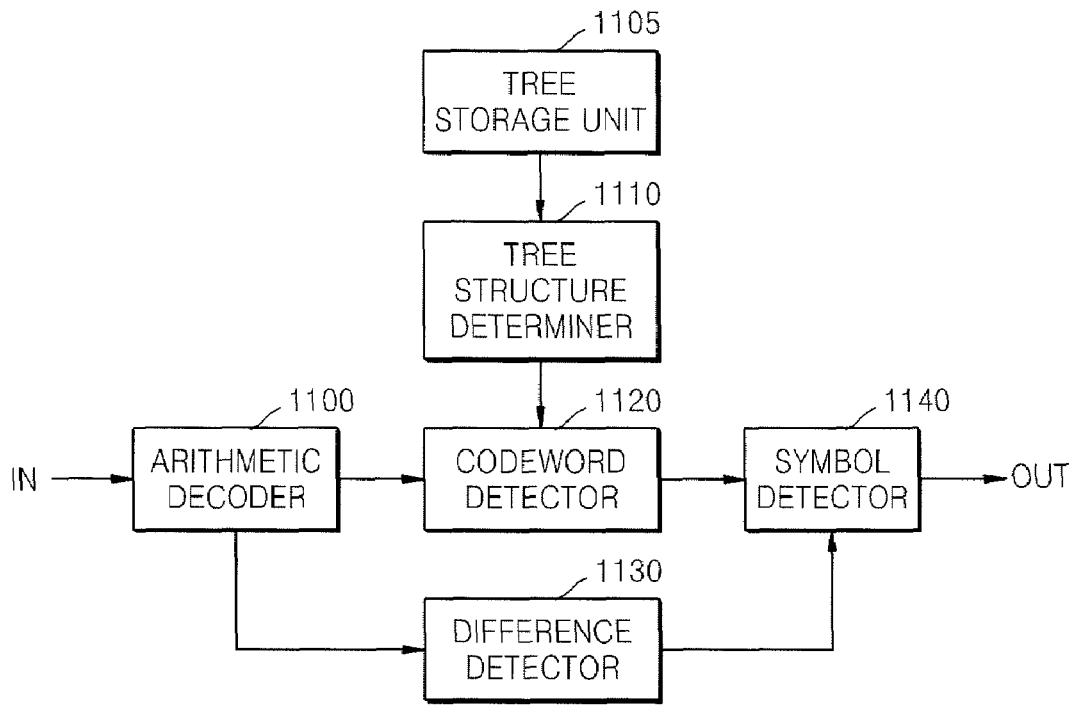
FIG. 11 is a block diagram illustrating an entropy decoding apparatus based on a tree structure according to another embodiment of the present general inventive concept.

FIG. 11 is a block diagram of an entropy decoding apparatus based on a tree structure according to another embodiment of the present general inventive concept. Referring to FIG. 11, the entropy decoding apparatus includes an arithmetic decoder 1100, a tree storage unit 1105, a tree structure determiner 1110, a codeword detector 1120, a difference detector 1130, and a symbol detector 1140.

The arithmetic decoder 1100 receives a bitstream from an encoding end via an input terminal IN and performs arithmetic decoding of the bitstream.

The tree storage unit 1105 stores a plurality of different tree structures in which an existence probability of each code is assigned to each node. While the plurality of tree structures stored in the probability storage unit 1005 of FIG. 10 have the same structure in which only the existence probability of each code is differently assigned to each node, the plurality of tree structures stored in the tree storage unit 1105 are different from each other in their structure.

The tree structure determiner 1110 determines a tree structure used in the encoding end from among the plurality of tree structures stored in the tree storage unit 1105. As an example of a method of determining a tree structure in the tree structure determiner 1110, the tree structure determiner 1110 can determine the tree structure used in the encoding end by receiving an index indicating the tree structure used in the encoding end from the encoding end.

The codeword detector 1120 detects a codeword corresponding to a probability of detecting each code of the codeword, which is a result of the arithmetic decoding performed by the arithmetic decoder 1100, using the tree structure determined by the tree structure determiner 1110.

The difference detector 1130 detects a difference between a representative value indicated by the codeword detected by the codeword detector 1120 and a value indicated by a symbol encoded in the encoding end using the result of the arithmetic decoding performed by the arithmetic decoder 1100.

The symbol detector 1140 detects a predetermined symbol from among symbols grouped corresponding to the codeword detected by the codeword detector 1120 using the difference detected by the difference detector 1130 and outputs the detected symbol via an output terminal OUT.

Figure 12:
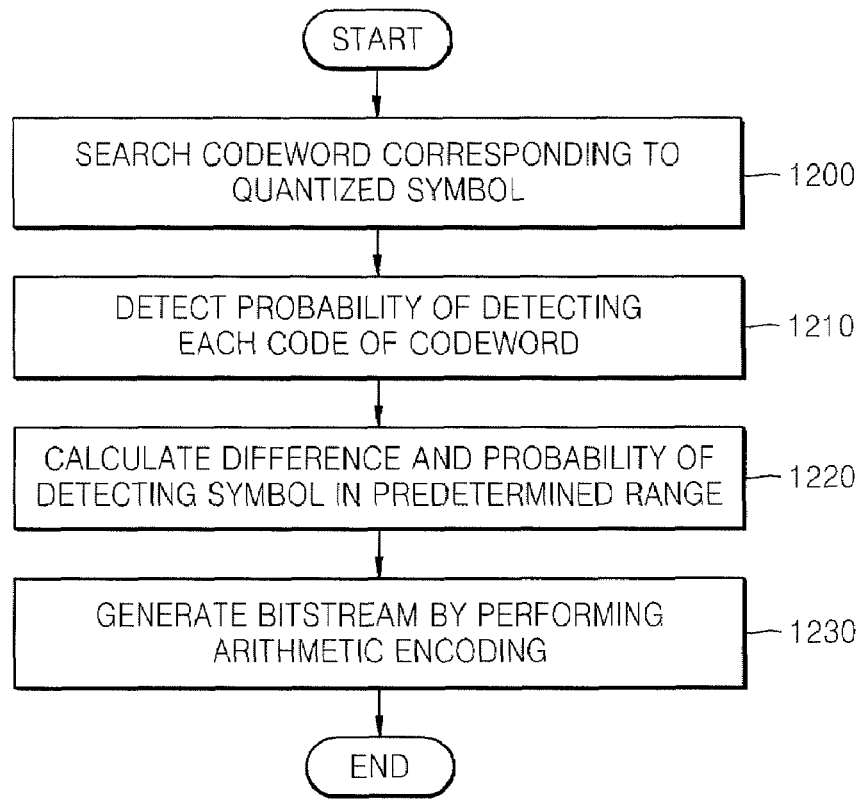
FIG. 12 is a flowchart illustrating an entropy encoding method based on a tree structure according to an embodiment of the present general inventive concept.

FIG. 12 is a flowchart illustrating an entropy encoding method based on a tree structure according to an embodiment of the present general inventive concept.

Referring to FIG. 12, a quantized symbol is received, a codeword corresponding to the quantized symbol is searched for, and the found codeword is output in operation 1200. An encoding end groups predetermined symbols and stores predetermined codewords corresponding to respective groups.

When symbols are grouped, the symbols can be grouped with a uniform spacing. FIG. 4 illustrates an illustration that symbols are grouped with the uniform spacing. In FIG. 4, symbols are grouped corresponding to each codeword {2, 0, 1, 3, 15, 7, 31, 63, 23, 127, 55, 255} with the uniform spacing of 4.

Alternatively, when symbols are grouped, the symbols can be grouped with a non-uniform spacing. FIG. 5 illustrates an illustration that symbols are grouped with the non-uniform spacing. In FIG. 5, symbols are grouped corresponding to each codeword {2, 0, 1, 3, 15, 7, 31, 63, 23, 127, 55, 255} with the non-uniform spacing of {1, 1, 1, 1, 1, 1, 1, 1, 2, 2, 32, 1<<31}. Accordingly, a length of each codeword is {2, 2, 2, 3, 5, 5, 6, 7, 6, 8, 6, 8}, a starting symbol of symbols contained in a symbol group of each codeword is {0, 1, 2, 3, 4, 5, 6, 7, 8, 10, 12, 44}, and a probability assigned to each codeword is {4973, 5684, 2580, 1243, 675, 387, 236, 158, 183, 99, 162, 3}.

When the symbols are grouped with the non-uniform spacing, symbols contained in a duration in which probabilities significantly vary are grouped with a wide spacing, and symbols contained in a duration in which probabilities insignificantly vary are grouped with a narrow spacing. For example, symbols of which a slope of a PDF is within a pre-set range can be grouped together. In FIG. 5, while the spacing is set to 1 for each of durations 0 through 8 in which probabilities significantly vary, the spacing is set to 2 for each of durations 8 through 12 in which probabilities more significantly vary, and the spacing is set to 32 and 1<<31 for durations 12 and more in which probabilities much more significantly vary.

In operation 1210, a probability of extracting each code of the codeword detected in operation 1200 is detected based on a tree structure in which an existence probability of each code is assigned to each node. The tree structure has a plurality of nodes, each node having a pre-set probability of extracting code '0' and a pre-set probability of extracting code '1'. For example, as illustrated in FIG. 6, in each node, a probability of extracting code '0' is assigned in the upper direction, and a probability of extracting code '1' is assigned in the lower direction.

In operation 1210, the probability of extracting each code of the detected codeword can be calculated using a probability of extracting a code assigned to each node in the tree structure as represented by Equations 13 and 14.

$$p_i(0) = \frac{p_{i-1}(0)}{p_{i-1}(0) + p_{i-1}(1)} \quad (13)$$

Here, $p_i(x)$ denotes a probability of extracting x in an $i^{th}$ node.

$$p_i(1) = \frac{p_{i-1}(1)}{p_{i-1}(0) + p_{i-1}(1)} \quad (14)$$

Here, $p_i(x)$ denotes a probability of extracting x in an $i^{th}$ node.

As an example of FIG. 6, when a codeword '110' is detected in operation 1200, a probability of extracting the first code '1' is detected as $p_1(1)=0.4$ by use of the tree structure illustrated in FIG. 6. A probability of extracting the second code '1' existing next to the first code is calculated using Equation 15.

$$p_2(1) = \frac{p_1(1)}{p_1(0) + p_1(1)} = \frac{0.2}{0.4} = 0.5 \quad (15)$$

A probability of extracting the third code '0' existing next to the codes '11' is calculated using Equation 16.

$$p_3(0) = \frac{p_2(0)}{p_2(0) + p_2(1)} = \frac{0.1}{0.2} = 0.5 \quad (16)$$

Thus, when the codeword '110' is detected in operation 1200, $\{p_1(1), p_2(1), p_3(0)\}=\{0.4, 0.5, 0.5\}$ is detected in operation 1210.

In operation 1220, a difference between a representative value indicated by the codeword detected in operation 1200 and a value indicated by the quantized symbol input in operation 1200 is calculated. The representative value indicated by the codeword is a value pre-set to the codeword to be representative of symbols contained in the codeword according to a predetermined condition, such as the smallest value or a mean value of the symbols contained in the codeword.

In operation 1220, a probability of detecting the quantized symbol input in operation 1200 from among the symbols contained in the codeword detected in operation 1200 is also calculated. When symbols are grouped with the uniform spacing as illustrated in FIG. 4, the probability of detecting the quantized symbol is a value calculated by setting the length of the uniform spacing to 1. Alternatively, when symbols are grouped with the non-uniform spacing as illustrated in FIG. 5, the probability of detecting the quantized symbol is a value calculated by setting the length of a spacing of a group to which the quantized symbol belongs to 1.

In operation 1230, a bitstream is generated by arithmetic-encoding the codeword detected in operation 1200 and the difference between the representative value indicated by the detected codeword and the value indicated by the quantized symbol, which was calculated in operation 1220, using the probability of extracting each code of the detected codeword, which was detected in operation 1210, and the probability of detecting the quantized symbol in a relevant duration, which was calculated in operation 1220.

Figure 13:
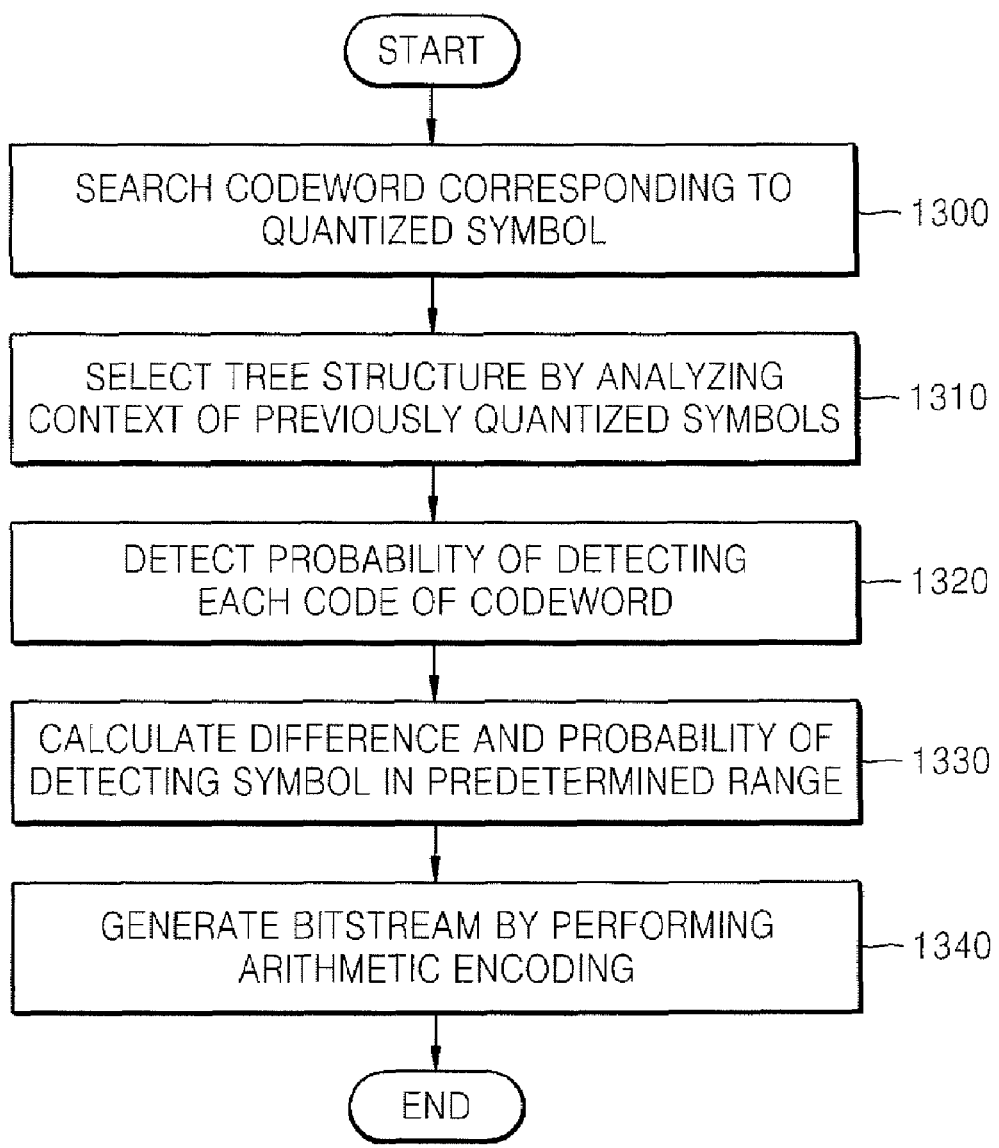
FIG. 13 is a flowchart illustrating an entropy encoding method based on a tree structure according to another embodiment of the present general inventive concept.

FIG. 13 is a flowchart illustrating an entropy encoding method based on a tree structure according to another embodiment of the present general inventive concept.

Referring to FIG. 13, a quantized symbol is received, a codeword corresponding to the quantized symbol is searched for, and the found codeword is output in operation 1300. An encoding end groups predetermined symbols and stores predetermined codewords corresponding to respective groups.

When symbols are grouped, the symbols can be grouped with a uniform spacing. FIG. 4 illustrates that symbols are grouped with the uniform spacing. In FIG. 4, symbols are grouped corresponding to each codeword $\{2, 0, 1, 3, 15, 7, 31, 63, 23, 127, 55, 255\}$ with the uniform spacing of 4.

Alternatively, when symbols are grouped, the symbols can be grouped with a non-uniform spacing. FIG. 5 illustrates an illustration that symbols are grouped with the non-uniform spacing. In FIG. 5, symbols are grouped corresponding to each codeword $\{2, 0, 1, 3, 15, 7, 31, 63, 23, 127, 55, 255\}$ with the non-uniform spacing of $\{1, 1, 1, 1, 1, 1, 1, 1, 2, 2, 32, 1<<31\}$. Accordingly, a length of each codeword is $\{2, 2, 2, 3, 5, 5, 6, 7, 6, 8, 6, 8\}$, a starting symbol of symbols contained in a symbol group of each codeword is $\{0, 1, 2, 3, 4, 5, 6, 7, 8, 10, 12, 44\}$, and a probability assigned to each codeword is $\{4973, 5684, 2580, 1243, 675, 387, 236, 158, 183, 99, 162, 3\}$.

When the symbols are grouped with the non-uniform spacing, symbols contained in a duration in which probabilities significantly vary are grouped with a wide spacing, and symbols contained in a duration in which probabilities insignificantly vary are grouped with a narrow spacing. For example, symbols of which a slope of a PDF is within a pre-set range can be grouped together. In FIG. 5, while the spacing is set to 1 for each of durations 0 through 8 in which probabilities significantly vary, the spacing is set to 2 for each of durations 8 through 12 in which probabilities more significantly vary, and the spacing is set to 32 and 1<<31 for durations 12 and more in which probabilities much more significantly vary.

In operation 1310, a predetermined tree structure is selected from among a plurality of tree structures stored in the encoding end by analyzing a context of previously quantized symbols. The encoding end stores the plurality of tree structures having the same structure, wherein an existence probability of each code is differently assigned to each node according to the plurality of tree structures. Accordingly, the plurality of tree structures stored in the encoding end have the same structure in which only the existence probability of each code is differently assigned to each node.

The tree structure has a plurality of nodes, each node having a pre-set probability of extracting code '0' and a pre-set probability of extracting code '1'. For example, as illustrated in FIG. 7, in each node, a probability of extracting code '0' is assigned in the upper direction, and a probability of extracting code '1' is assigned in the lower direction. In FIG. 7, PDF1 and PDF2 having the same tree structure in which an existence probability of each code is differently assigned to each node are stored.

When the context of the previously quantized symbols is analyzed in operation 1310, the predetermined tree structure can be selected by analyzing the context of quantized symbols of a previous frame and then analyzing a context of quantized symbols of a current frame. If data of the previous frame does not exist, the predetermined tree structure can be selected by analyzing only the context of the quantized symbols of the current frame.

FIG. 8A illustrates a conceptual diagram of selecting a tree structure by analyzing a context of a previous frame and a context of a current frame in operation 1310. In FIG. 8A, PC denotes a value corresponding to the context of the previous frame, CC denotes a value corresponding to the context of the current frame, and ID denotes an identification number of each tree structure stored in the probability storage unit 210. If it is detected in operation 1310 that PC=0 and CC=1, a tree structure having ID '1' is selected in operation 1310 from among the plurality of tree structures stored in the encoding end. However, if data of the previous frame does not exist, the predetermined tree structure is selected in operation 1310 using only CC, which is a value of the context of the current frame, as illustrated in FIG. 8B.

In operation 1320, a probability of extracting each code of the codeword detected in operation 1300 using the tree structure selected in operation 1310.

In operation 1320, the probability of extracting each code of the detected codeword can be calculated using a probability of extracting a code assigned to each node in the selected tree structure as represented by Equations 17 and 18.

$$p_i(0) = \frac{p_{i-1}(0)}{p_{i-1}(0) + p_{i-1}(1)} \tag{17}$$

Here, $p_i(x)$ denotes a probability of extracting x in an $i^{th}$ node.

$$p_i(1) = \frac{p_{i-1}(1)}{p_{i-1}(0) + p_{i-1}(1)} \tag{18}$$

Here, $p_i(x)$ denotes a probability of extracting x in an $i^{th}$ node.

As an example of FIG. 7, when a codeword '110' is detected in operation 1300, and when a tree structure corresponding to PDF1 is selected in operation 1310, a probability of extracting the first code '1' is detected as $p_1(1)=0.4$ by use of the tree structure illustrated in FIG. 7. A probability of extracting the second code '1' existing next to the first code is calculated using Equation 19.

$$p_2(1) = \frac{p_1(1)}{p_1(0) + p_1(1)} = \frac{0.2}{0.4} = 0.5 \tag{19}$$

A probability of extracting the third code '0' existing next to the codes '11' is calculated using Equation 20.

$$p_3(0) = \frac{p_2(0)}{p_2(0) + p_2(1)} = \frac{0.1}{0.2} = 0.5 \tag{20}$$

Thus, when the codeword '110' is detected in operation 1300, $\{p_1(1), p_2(1), p_3(0)\}=\{0.4, 0.5, 0.5\}$ is detected in operation 1320.

However, when the codeword '110' is detected in operation 1300, and when a tree structure corresponding to PDF2 is selected in operation 1310, a probability of extracting the first code '1' is detected as $p_1(1)=0.87$ by use of the tree structure illustrated in FIG. 7. A probability of extracting the second code '1' existing next to the first code is calculated using Equation 21.

$$p_2(1) = \frac{p_1(1)}{p_1(0) + p_1(1)} = \frac{0.86}{0.87} = 0.99 \tag{21}$$

A probability of extracting the third code '0' existing next to the codes '11' is calculated using Equation 22.

$$p_3(0) = \frac{p_2(0)}{p_2(0) + p_2(1)} = \frac{0.3}{0.99} = 0.30 \tag{22}$$

Thus, when the codeword '110' is detected in operation 1300, $\{p_1(1), p_2(1), p_3(0)\}=\{0.87, 0.99, 0.30\}$ is detected in operation 1320.

Thus, even when the same codeword '110' is detected in operation 1300 and the encoding end stores the same tree structures, since different probabilities are assigned to each node, $\{p_1(1), p_2(1), p_3(0)\}=\{0.4, 0.5, 0.5\}$ is output in operation 1320 if the tree structure corresponding to PDF1 is selected in operation 1310, whereas $\{p_1(1), p_2(1), p_3(0)\}=\{0.87, 0.99, 0.30\}$ is output in operation 1320 if the tree structure corresponding to PDF2 is selected in operation 1310.

In operation 1330, a difference between a representative value indicated by the codeword detected in operation 1300 and a value indicated by the quantized symbol input in operation 1300 is calculated. The representative value indicated by the codeword is a value pre-set to the codeword to be representative of symbols contained in the codeword according to a predetermined condition, such as the smallest value or a mean value of the symbols contained in the codeword.

In operation 1330, a probability of detecting the quantized symbol input in operation 1300 from among the symbols contained in the codeword detected in operation 1300 is also calculated. When symbols are grouped with the uniform spacing as illustrated in FIG. 4, the probability of detecting the quantized symbol is a value calculated by setting the length of the uniform spacing to 1. Alternatively, when symbols are grouped with the non-uniform spacing as illustrated in FIG. 5, the probability of detecting the quantized symbol is a value calculated by setting the length of a spacing of a group to which the quantized symbol belongs to 1.

In operation 1340, a bitstream is generated by arithmetic-encoding the codeword detected in operation 1300 and the difference between the representative value indicated by the detected codeword and the value indicated by the quantized symbol, which was calculated in operation 1330, using the probability of extracting each code of the detected codeword, which was detected in operation 1320, and the probability of detecting the quantized symbol in a relevant duration, which was calculated in operation 1330.

Figure 14:
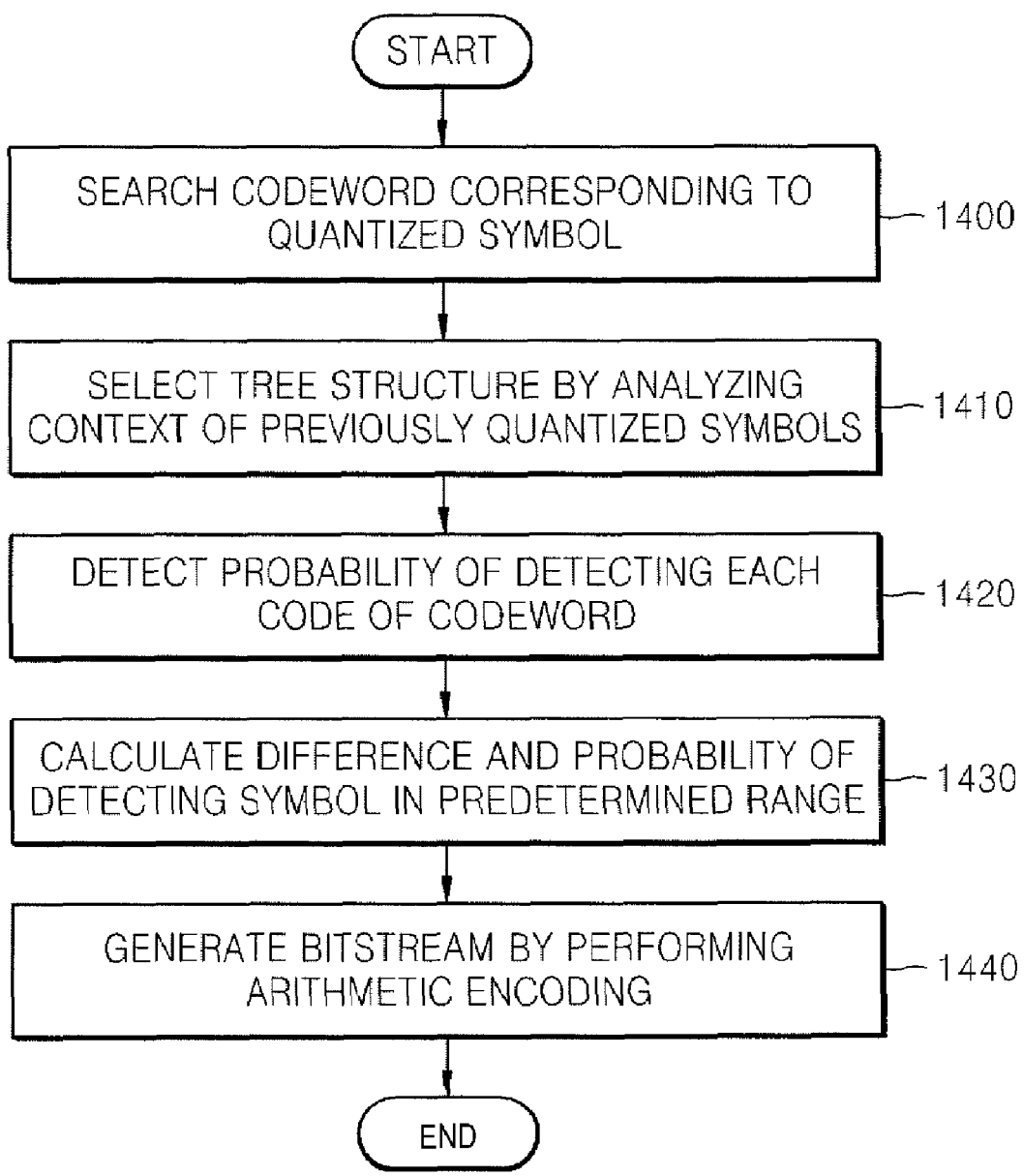
FIG. 14 is a flowchart illustrating an entropy encoding method based on a tree structure according to another embodiment of the present general inventive concept.

FIG. 14 is a flowchart illustrating an entropy encoding method based on a tree structure according to another embodiment of the present general inventive concept.

Referring to FIG. 14, a quantized symbol is received, a codeword corresponding to the quantized symbol is searched for, and the found codeword is output in operation 1400. An encoding end groups predetermined symbols and stores predetermined codewords corresponding to respective groups.

When symbols are grouped, the symbols can be grouped with a uniform spacing. FIG. 4 illustrates an illustration that symbols are grouped with uniform spacing. In FIG. 4, symbols are grouped corresponding to each codeword {2, 0, 1, 3, 15, 7, 31, 63, 23, 127, 55, 255} with the uniform spacing of 4.

Alternatively, when symbols are grouped, the symbols can be grouped with non-uniform spacing. FIG. 5 illustrates an illustration that symbols are grouped with the non-uniform spacing. In FIG. 5, symbols are grouped corresponding to each codeword {2, 0, 1, 3, 15, 7, 31, 63, 23, 127, 55, 255} with the non-uniform spacing of {1, 1, 1, 1, 1, 1, 1, 1, 2, 2, 32, 1<<31}. Accordingly, the length of each codeword is {2, 2, 2, 3, 5, 5, 6, 7, 6, 8, 6, 8}, a starting symbol of symbols contained in a symbol group of each codeword is {0, 1, 2, 3, 4, 5, 6, 7, 8, 10, 12, 44}, and a probability assigned to each codeword is {4973, 5684, 2580, 1243, 675, 387, 236, 158, 183, 99, 162, 3}.

When the symbols are grouped with the non-uniform spacing, symbols contained in a duration in which probabilities significantly vary are grouped with a wide spacing, and symbols contained in a duration in which probabilities insignificantly vary are grouped with a narrow spacing. For example, symbols of which a slope of a PDF is within a pre-set range can be grouped together. In FIG. 5, while the spacing is set to 1 for each of durations 0 through 8 in which probabilities significantly vary, the spacing is set to 2 for each of durations 8 through 12 in which probabilities more significantly vary, and the spacing is set to 32 and 1<<31 for durations 12 and more in which probabilities much more significantly vary.

In operation 1410, a predetermined tree structure is selected from among a plurality of tree structures stored in the encoding end by analyzing a context of previously quantized symbols. The encoding end stores the plurality of different tree structures in which an existence probability of each code is assigned to each node. While the plurality of tree structures stored in the embodiment of FIG. 13 have the same structure in which only the existence probability of each code is differently assigned to each node, the plurality of tree structures stored in the embodiment of FIG. 14 are different from each other in their structure.

When the context of the previously quantized symbols is analyzed in operation 1410, the predetermined tree structure can be selected by analyzing the context of quantized symbols of a previous frame and then analyzing a context of quantized symbols of a current frame. If data of the previous frame does not exist, the predetermined tree structure can be selected by analyzing only the context of the quantized symbols of the current frame.

FIG. 8A illustrates a conceptual diagram illustrating selecting a tree structure by analyzing a context of a previous frame and a context of a current frame in operation 1410. In FIG. 8A, PC denotes a value corresponding to the context of the previous frame, CC denotes a value corresponding to the context of the current frame, and ID denotes an identification number of each tree structure stored in the probability storage unit 210. If it is detected in operation 1410 that PC=0 and CC=1, a tree structure having ID '1' is selected in operation 1410 from among the plurality of tree structures stored in the encoding end. However, if data of the previous frame does not exist, the predetermined tree structure is selected in operation 1410 using only CC, which is a value of the context of the current frame, as illustrated in FIG. 8B.

In operation 1420, a probability of extracting each code of the codeword detected in operation 1400 using the tree structure selected in operation 1410.

In operation 1420, the probability of extracting each code of the detected codeword can be calculated using a probability of extracting a code assigned to each node in the selected tree structure as represented by Equations 24 and 25.

$$p_i(0) = \frac{p_{i-1}(0)}{p_{i-1}(0) + p_{i-1}(1)} \quad (24)$$

Here, $p_i(x)$ denotes a probability of extracting x in an $i^{th}$ node.

$$p_i(1) = \frac{p_{i-1}(1)}{p_{i-1}(0) + p_{i-1}(1)} \quad (25)$$

Here, $p_i(x)$ denotes a probability of extracting x in an $i^{th}$ node.

In operation 1430, a difference between a representative value indicated by the codeword detected in operation 1400 and a value indicated by the quantized symbol input in operation 1400 is calculated. The representative value indicated by the codeword is a value pre-set to the codeword to be representative of symbols contained in the codeword according to a predetermined condition, such as the smallest value or a mean value of the symbols contained in the codeword.

In operation 1430, a probability of detecting the quantized symbol input in operation 1400 from among the symbols contained in the codeword detected in operation 1400 is also calculated. When symbols are grouped with the uniform spacing as illustrated in FIG. 4, the probability of detecting the quantized symbol is a value calculated by setting the length of the uniform spacing to 1. Alternatively, when symbols are grouped with the non-uniform spacing as illustrated in FIG. 5, the probability of detecting the quantized symbol is a value calculated by setting the length of a spacing of a group to which the quantized symbol belongs to 1.

In operation 1440, a bitstream is generated by arithmetic-encoding the codeword detected in operation 1400 and the difference between the representative value indicated by the detected codeword and the value indicated by the quantized symbol, which was calculated in operation 1430, using the probability of extracting each code of the detected codeword, which was detected in operation 1420, and the probability of detecting the quantized symbol in a relevant duration, which was calculated in operation 1430.

Figure 15:
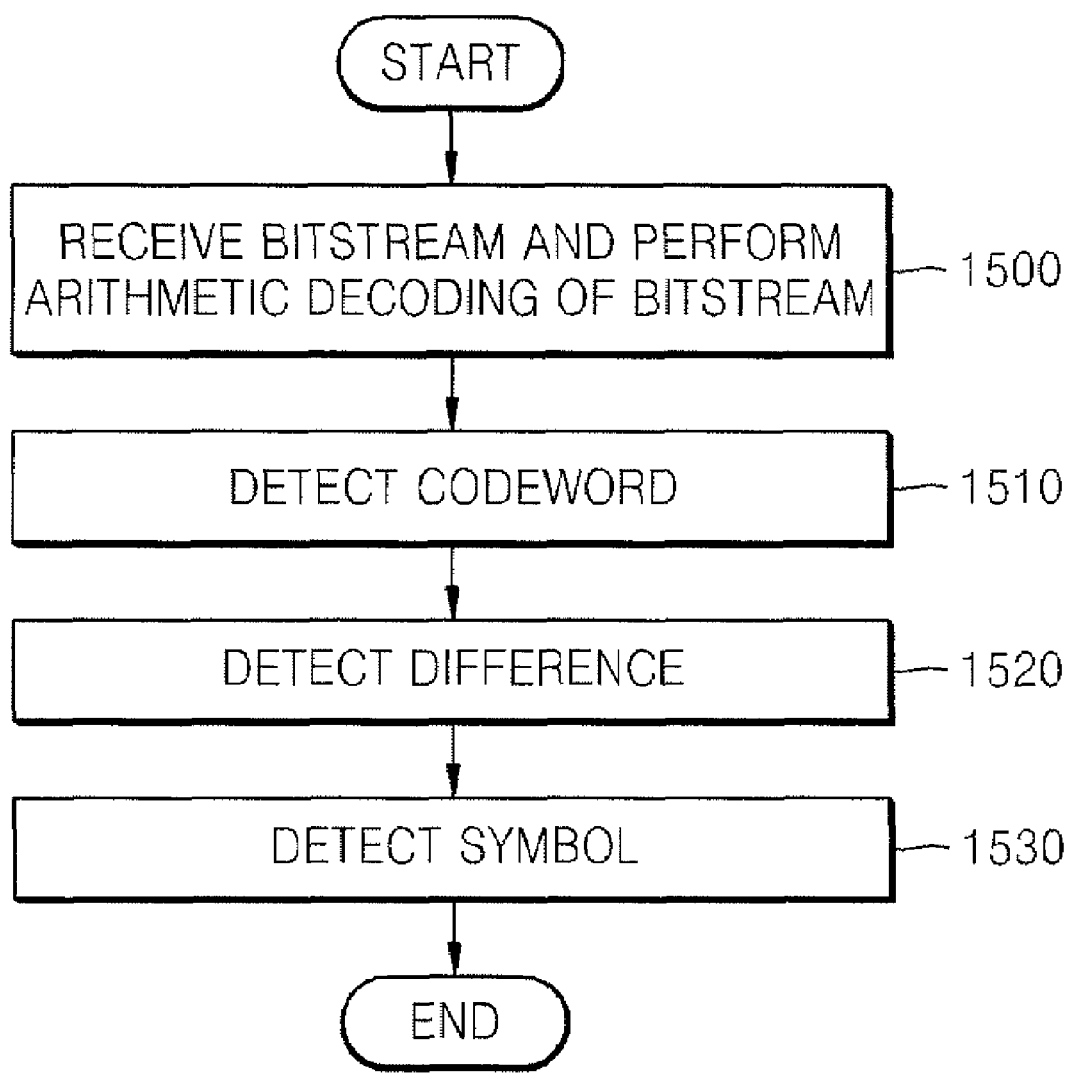
FIG. 15 is a flowchart illustrating an entropy decoding method based on a tree structure according to an embodiment of the present general inventive concept.

FIG. 15 is a flowchart illustrating an entropy decoding method based on a tree structure according to an embodiment of the present general inventive concept.

Referring to FIG. 15, a bitstream is received from an encoding end and arithmetic-decoded in operation 1500.

A codeword is detected in operation 1510 using a probability of detecting each code of the codeword, which is a result of the arithmetic decoding performed in operation 1500, based on a tree structure in which an existence probability of each code is assigned to each node.

In operation 1520, a difference between a representative value indicated by the codeword detected in operation 1510 and a value indicated by a symbol encoded in the encoding end is detected using the result of the arithmetic decoding performed in operation 1500.

In operation 1530, a predetermined symbol is detected from among symbols grouped corresponding to the codeword detected in operation 1510 using the difference detected in operation 1520.

Figure 16:
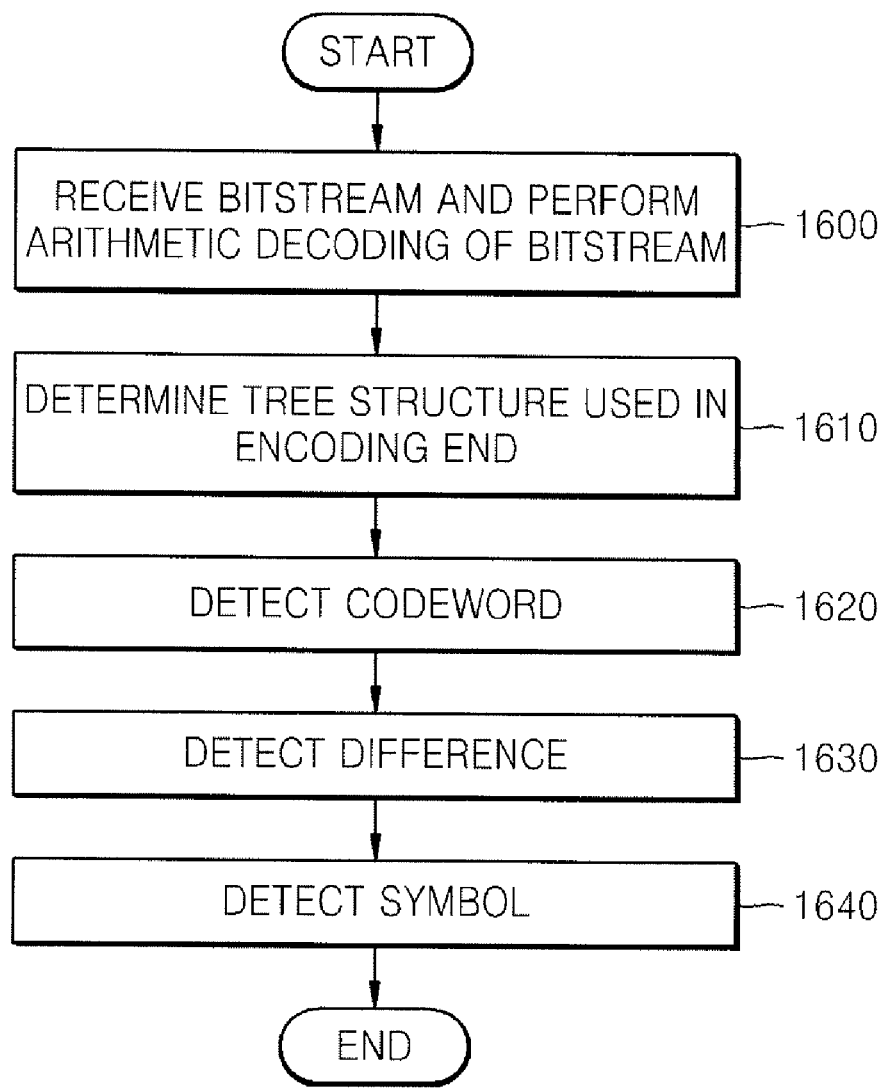
FIG. 16 is a flowchart illustrating an entropy decoding method based on a tree structure according to another embodiment of the present general inventive concept.

FIG. 16 is a flowchart illustrating an entropy decoding method based on a tree structure according to another embodiment of the present general inventive concept.

Referring to FIG. 16, a bitstream is received from an encoding end and arithmetic-decoded in operation 1600.

In operation 1610, a tree structure used in the encoding end is determined from among a plurality of tree structures stored in a decoding end. The decoding end stores a plurality of tree structures having the same structure, wherein an existence probability of each code is differently assigned to each node according to the plurality of tree structures. Accordingly, the plurality of tree structures stored in the decoding end have the same structure in which only the existence probability of each code is differently assigned to each node.

As an example of a method of determining a tree structure in operation 1610, the tree structure used in the encoding end can be determined by receiving an index indicating the tree structure used in the encoding end from the encoding end.

In operation 1620, a codeword corresponding to a probability of detecting each code of the codeword, which is a result of the arithmetic decoding performed in operation 1600, is detected using the tree structure determined in operation 1610.

In operation 1630, a difference between a representative value indicated by the codeword detected in operation 1620 and a value indicated by a symbol encoded in the encoding end is detected using the result of the arithmetic decoding performed in operation 1600.

In operation 1640, a predetermined symbol is detected from among symbols grouped corresponding to the codeword detected in operation 1620 using the difference detected in operation 1630.

Figure 17:
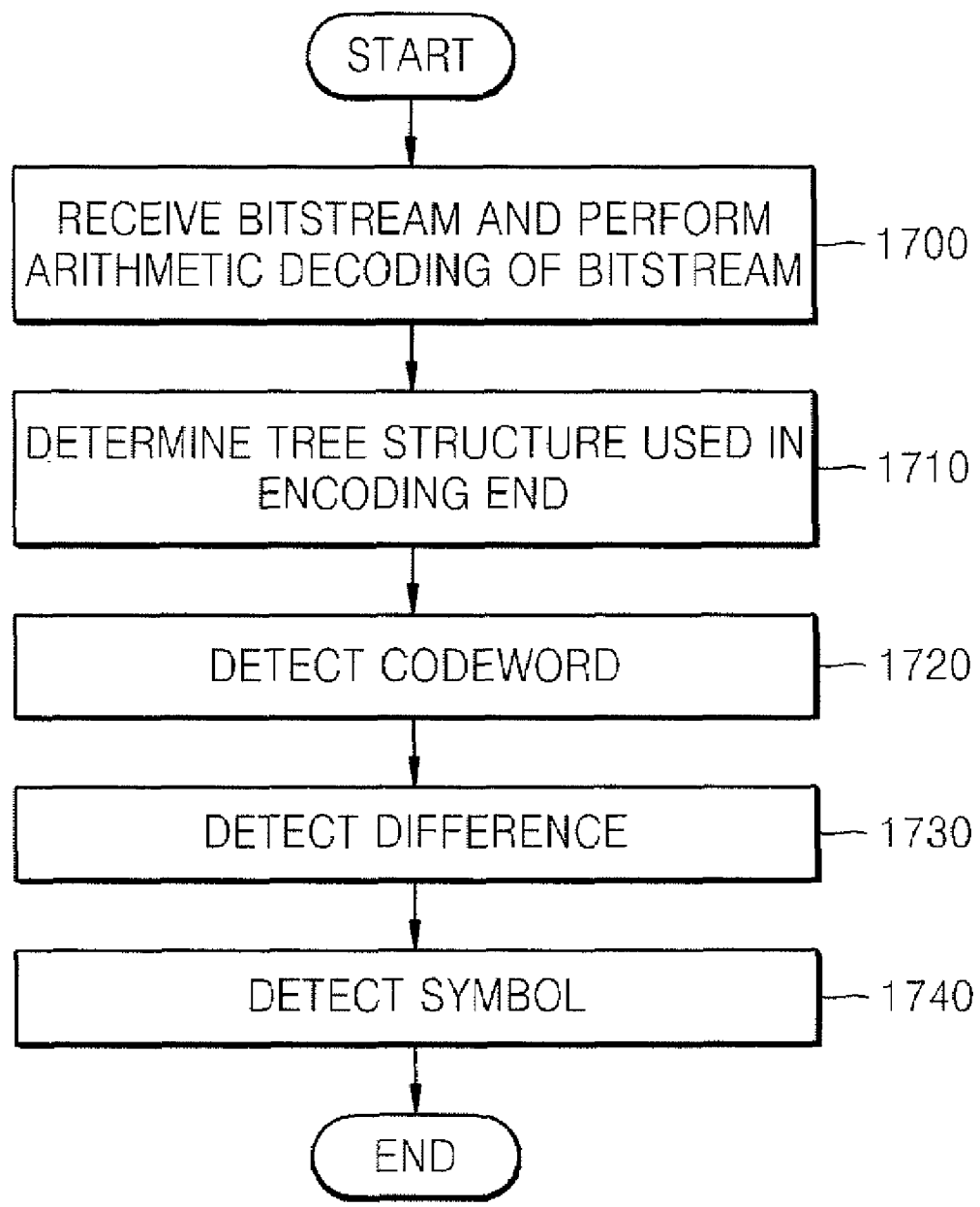
FIG. 17 is a flowchart illustrating an entropy decoding method based on a tree structure according to another embodiment of the present general inventive concept.

FIG. 17 is a flowchart illustrating an entropy decoding method based on a tree structure according to another embodiment of the present general inventive concept.

Referring to FIG. 17, a bitstream is received from an encoding end and arithmetic-decoded in operation 1700.

In operation 1710, a tree structure used in the encoding end is determined from among a plurality of tree structures stored in a decoding end. The decoding end stores a plurality of different tree structures in which an existence probability of each code is assigned to each node. While the plurality of tree structures stored in the decoding end in the embodiment of FIG. 16 have the same structure in which only the existence probability of each code is differently assigned to each node, the plurality of tree structures stored in the decoding end in the embodiment of FIG. 17 are different from each other in their structure.

As an example of a method of determining a tree structure in operation 1710, the tree structure used in the encoding end can be determined by receiving an index indicating the tree structure used in the encoding end from the encoding end.

In operation 1720, a codeword corresponding to a probability of detecting each code of the codeword, which is a result of the arithmetic decoding performed in operation 1700, is detected using the tree structure determined in operation 1710.

In operation 1730, a difference between a representative value indicated by the codeword detected in operation 1720 and a value indicated by a symbol encoded in the encoding end is detected using the result of the arithmetic decoding performed in operation 1700.

In operation 1740, a predetermined symbol is detected from among symbols grouped corresponding to the codeword detected in operation 1720 using the difference detected in operation 1730.

The general inventive concept can also be embodied as computer-readable codes on a computer-readable medium. The computer-readable medium can include a computer-readable recording medium and a computer-readable transmission medium. The computer readable recording medium is any data storage device that can store data which can be thereafter read by a computer system. Examples of the computer readable recording medium include read-only memory (ROM), random-access memory (RAM), CD-ROMs, magnetic tapes, floppy disks, and optical data storage devices. The computer-readable recording medium can also be distributed over network coupled computer systems so that the computer-readable code is stored and executed in a distributed fashion. The computer-readable transmission medium can transmit carrier waves or signals (e.g., wired or wireless data transmission through the Internet). Also, functional programs, codes, and code segments to accomplish the present general inventive concept can be easily construed by programmers skilled in the art to which the present general inventive concept pertains.

As described above, according to various embodiments of the present general inventive concept, entropy encoding decoding are performed based on a tree structure. By doing this, coding efficiency is increased, complexity is reduced, and additional information can be reduced. In addition, even when the present general inventive concept is applied to scalable coding, coding efficiency can be prevented from being decreased.

Although a few embodiments of the present general inventive concept have been illustrated and described, it will be appreciated by those skilled in the art that changes may be made in these embodiments without departing from the principles and spirit of the general inventive concept, the scope of which is defined in the appended claims and their equivalents.

What is claimed is:

1. An entropy encoding apparatus, comprising:
    a codeword detector to detect a codeword corresponding to a specific symbol from among stored codewords, each stored codeword corresponding to predetermined grouped symbols;
    a probability detector to detect a probability value corresponding to each code of the detected codeword based on a tree structure in which an existence probability of each code is assigned to each node;
    a difference calculator to calculate a difference between a representative value indicated by the detected codeword and a value indicated by the specific symbol and to calculate a probability of detecting the specific symbol from among symbols contained in the detected codeword; and
    an arithmetic encoder to arithmetically encode the detected codeword and the calculated difference using the calculated probabilities.

2. The entropy encoding apparatus of claim 1, wherein the symbols are grouped with a uniform spacing.

3. The entropy encoding apparatus of claim 1, wherein the symbols are grouped with a non-uniform spacing.

4. The entropy encoding apparatus of claim 3, wherein the symbols are grouped with a wide spacing in a duration in which probabilities significantly vary and grouped with a narrow spacing in a duration in which probabilities insignificantly vary.

5. An entropy encoding apparatus, comprising:
    a codeword detector to detect a codeword corresponding to a specific symbol from among stored codewords, each stored codeword corresponding to predetermined grouped symbols;

a selector to select a predetermined tree structure from among a plurality of tree structures in which an existence probability of each code is differently assigned to each node, based on a context of previous symbols;

a probability detector to detect a probability value corresponding to each code of the detected codeword based on the selected tree structure;

a difference calculator to calculate a difference between a representative value indicated by the detected codeword and a value indicated by the specific symbol and calculating a probability of detecting the specific symbol from among symbols contained in the detected codeword; and an arithmetic encoder to arithmetically encode the detected codeword and the calculated difference using the calculated probabilities.

6. The entropy encoding apparatus of claim 5, wherein the selector selects a tree structure by analyzing the context of previous symbols and then analyzing a context of current symbols.

7. The entropy encoding apparatus of claim 5, wherein the selector selects a tree structure by analyzing a context of current symbols, if data of the previous symbols does not exist.

8. The entropy encoding apparatus of claim 5, wherein the symbols are grouped with a uniform spacing.

9. The entropy encoding apparatus of claim 5, wherein the symbols are grouped with a non-uniform spacing.

10. The entropy encoding apparatus of claim 9, wherein the symbols are grouped with a wide spacing in a duration in which probabilities significantly vary and grouped with a narrow spacing in a duration in which probabilities insignificantly vary.

11. An entropy encoding apparatus, comprising:

a codeword detector to detect a codeword corresponding to a specific symbol from among stored codewords, each stored codeword corresponding to predetermined grouped symbols;

a selector to select a predetermined tree structure from among a plurality of different tree structures in which an existence probability of each code is assigned to each node, based on a context of previous symbols;

a probability detector to detect a probability value corresponding to each code of the detected codeword based on the selected tree structure;

a difference calculator to calculate a difference between a representative value indicated by the detected codeword and a value indicated by the specific symbol and to calculate a probability of detecting the specific symbol from among symbols contained in the detected codeword; and an arithmetic encoder to arithmetically encode the detected codeword and the calculated difference using the calculated probabilities.

12. The entropy encoding apparatus of claim 11, wherein the selector selects a tree structure by analyzing the context of the previous symbols and then analyzing a context of current symbols.

13. The entropy encoding apparatus of claim 11, wherein the selector selects a tree structure by analyzing a context of current symbols, if data of the previous symbols does not exist.

14. The entropy encoding apparatus of claim 11, wherein the symbols are grouped with a uniform spacing.

15. The entropy encoding apparatus of claim 11, wherein the symbols are grouped with a non-uniform spacing.

16. The entropy encoding apparatus of claim 15, wherein the symbols are grouped with a wide spacing in a duration in which probabilities significantly vary and grouped with a narrow spacing in a duration in which probabilities insignificantly vary.

17. An entropy decoding apparatus, comprising:

a codeword detector to detect a codeword by performing arithmetic-decoding based on a tree structure in which an existence probability of each code is assigned to each node;

a difference detector to detect a difference between a representative value indicated by the detected codeword and a value indicated by a symbol specified in an encoding end by performing arithmetic-decoding; and a symbol detector to detect the specified symbol from among symbols grouped corresponding to the detected codeword using the detected difference.

18. The entropy decoding apparatus of claim 17, wherein the symbols are grouped with a uniform spacing.

19. The entropy decoding apparatus of claim 17, wherein the symbols are grouped with a non-uniform spacing.

20. The entropy decoding apparatus of claim 19, wherein the symbols are grouped with a wide spacing in a duration in which probabilities significantly vary and grouped with a narrow spacing in a duration in which probabilities insignificantly vary.

21. An entropy decoding apparatus, comprising:

a tree structure determiner to determine a tree structure used in an encoding end from among a plurality of tree structures in which an existence probability of each code is differently assigned to each node;

a codeword detector to detect a codeword by arithmetic-decoding a bitstream based on the determined tree structure;

a difference detector to detect a difference between a representative value indicated by the detected codeword and a value indicated by a symbol specified in an encoding end by performing arithmetic-decoding; and a symbol detector to detect the specified symbol from among symbols grouped corresponding to the detected codeword using the detected difference.

22. The entropy decoding apparatus of claim 21, wherein the symbols are grouped with a uniform spacing.

23. The entropy decoding apparatus of claim 21, wherein the symbols are grouped with a non-uniform spacing.

24. The entropy decoding apparatus of claim 23, wherein the symbols are grouped with a wide spacing in a duration in which probabilities significantly vary and grouped with a narrow spacing in a duration in which probabilities insignificantly vary.

25. An entropy decoding apparatus, comprising:

a tree structure determiner to determine a tree structure used in an encoding end from among a plurality of different tree structures in which an existence probability of each code is assigned to each node;

a codeword detector to detect a codeword by performing arithmetic-decoding based on the determined tree structure;

a difference detector to detect a difference between a representative value indicated by the detected codeword and a value indicated by a symbol specified in an encoding end by performing arithmetic-decoding; and a symbol detector to detect the specified symbol from among symbols grouped corresponding to the detected codeword using the detected difference.

26. The entropy decoding apparatus of claim 25, wherein the symbols are grouped with a uniform spacing.

27. The entropy decoding apparatus of claim 25, wherein the symbols are grouped with a non-uniform spacing.

28. The entropy decoding apparatus of claim 27, wherein the symbols are grouped with a wide spacing in a duration in which probabilities significantly vary and grouped with a narrow spacing in a duration in which probabilities insignificantly vary.

29. An entropy encoding method, comprising:
detecting a codeword corresponding to a specific symbol from among stored codewords, each stored codeword corresponding to predetermined grouped symbols;
detecting a probability value corresponding to each code of the detected codeword based on a tree structure in which an existence probability of each code is assigned to each node;
calculating a difference between a representative value indicated by the detected codeword and a value indicated by the specific symbol and calculating a probability of detecting the specific symbol from among symbols contained in the detected codeword; and
arithmetically encoding the detected codeword and the calculated difference using the calculated probabilities.

30. The entropy encoding method of claim 29, wherein the symbols are grouped with a uniform spacing.

31. The entropy encoding method of claim 29, wherein the symbols are grouped with a non-uniform spacing.

32. The entropy encoding method of claim 31, wherein the symbols are grouped with a wide spacing in a duration in which probabilities significantly vary and grouped with a narrow spacing in a duration in which probabilities insignificantly vary.

33. An entropy encoding method, comprising:
detecting a codeword corresponding to a specific symbol from among stored codewords, each stored codeword corresponding to predetermined grouped symbols;
selecting a predetermined tree structure from among a plurality of tree structures in which an existence probability of each code is differently assigned to each node, based on a context of previous symbols;
detecting a probability value corresponding to each code of the detected codeword based on the selected tree structure;
calculating a difference between a representative value indicated by the detected codeword and a value indicated by the specific symbol and calculating a probability of detecting the specific symbol from among symbols contained in the detected codeword; and
arithmetically encoding the detected codeword and the calculated difference using the calculated probabilities.

34. The entropy encoding method of claim 33, wherein the selecting comprises:
selecting a tree structure by analyzing the context of previous symbols and then analyzing a context of current symbols.

35. The entropy encoding method of claim 33, wherein the selecting comprises:
selecting a tree structure by analyzing a context of current symbols, if data of the previous symbols does not exist.

36. The entropy encoding method of claim 33, wherein the symbols are grouped with a uniform spacing.

37. The entropy encoding method of claim 33, wherein the symbols are grouped with a non-uniform spacing.

38. The entropy encoding method of claim 37, wherein the symbols are grouped with a wide spacing in a duration in which probabilities significantly vary and grouped with a narrow spacing in a duration in which probabilities insignificantly vary.

39. An entropy encoding method, comprising:
detecting a codeword corresponding to a specific symbol from among stored codewords, each stored codeword corresponding to predetermined grouped symbols;
selecting a predetermined tree structure from among a plurality of different tree structures in which an existence probability of each code is assigned to each node, based on a context of previous symbols;
detecting a probability value corresponding to each code of the detected codeword based on the selected tree structure;
calculating a difference between a representative value indicated by the detected codeword and a value indicated by the specific symbol and calculating a probability of detecting the specific symbol from among symbols contained in the detected codeword; and
arithmetically encoding the detected codeword and the calculated difference using the calculated probabilities.

40. The entropy encoding method of claim 39, wherein the selecting comprises:
selecting a tree structure by analyzing the context of the previous symbols and then analyzing a context of current symbols.

41. The entropy encoding method of claim 39, wherein the selecting comprises:
selecting a tree structure by analyzing a context of current symbols, if data of the previous symbols does not exist.

42. The entropy encoding method of claim 39, wherein the symbols are grouped with a uniform spacing.

43. The entropy encoding method of claim 39, wherein the symbols are grouped with a non-uniform spacing.

44. The entropy encoding method of claim 43, wherein the symbols are grouped with a wide spacing in a duration in which probabilities significantly vary and grouped with a narrow spacing in a duration in which probabilities insignificantly vary.

45. An entropy decoding method, comprising:
detecting a codeword by performing arithmetic-decoding based on a tree structure in which an existence probability of each code is assigned to each node;
detecting a difference between a representative value indicated by the detected codeword and a value indicated by a symbol specified in an encoding end by performing arithmetic-decoding; and
detecting the specified symbol from among symbols grouped corresponding to the detected codeword using the detected difference.

46. The entropy decoding method of claim 45, wherein the symbols are grouped with a uniform spacing.

47. The entropy decoding method of claim 45, wherein the symbols are grouped with a non-uniform spacing.

48. The entropy decoding method of claim 47, wherein the symbols are grouped with a wide spacing in a duration in which probabilities significantly vary and grouped with a narrow spacing in a duration in which probabilities insignificantly vary.

49. An entropy decoding method, comprising:
determining a tree structure used in an encoding end from among a plurality of tree structures in which an existence probability of each code is differently assigned to each node;
detecting a codeword by arithmetic-decoding a bitstream based on the determined tree structure;
detecting a difference between a representative value indicated by the detected codeword and a value indicated by a symbol specified in an encoding end by performing arithmetic-decoding; and detecting the specified symbol from among symbols grouped corresponding to the detected codeword using the detected difference.

50. The entropy decoding method of claim 49, wherein the symbols are grouped with a uniform spacing.

51. The entropy decoding method of claim 49, wherein the symbols are grouped with a non-uniform spacing.

52. The entropy decoding method of claim 51, wherein the symbols are grouped with a wide spacing in a duration in which probabilities significantly vary and grouped with a narrow spacing in a duration in which probabilities insignificantly vary.

53. An entropy decoding method, comprising:
determining a tree structure used in an encoding end from among a plurality of different tree structures in which an existence probability of each code is assigned to each node;
detecting a codeword by arithmetic-decoding a bitstream based on the determined tree structure;
detecting a difference between a representative value indicated by the detected codeword and a value indicated by a symbol specified in an encoding end by performing arithmetic-decoding; and
detecting the specified symbol from among symbols grouped corresponding to the detected codeword using the detected difference.

54. The entropy decoding method of claim 53, wherein the symbols are grouped with a uniform spacing.

55. The entropy decoding method of claim 53, wherein the symbols are grouped with a non-uniform spacing.

56. The entropy decoding method of claim 55, wherein the symbols are grouped with a wide spacing in a duration in which probabilities significantly vary and grouped with a narrow spacing in a duration in which probabilities insignificantly vary.

57. A computer-readable recording medium having embodied thereon a computer program to execute a method, wherein the method comprises:
detecting a codeword corresponding to a specific symbol from among stored codewords, each stored codeword corresponding to predetermined grouped symbols;
detecting a probability value corresponding to each code of the detected codeword based on a tree structure in which an existence probability of each code is assigned to each node;
calculating a difference between a representative value indicated by the detected codeword and a value indicated by the specific symbol and calculating a probability of detecting the specific symbol from among symbols contained in the detected codeword; and
arithmetically encoding the detected codeword and the calculated difference using the calculated probabilities.

58. A computer-readable recording medium having embodied thereon a computer program to execute a method, wherein the method comprises:
detecting a codeword corresponding to a specific symbol from among stored codewords, each stored codeword corresponding to predetermined grouped symbols;
selecting a predetermined tree structure from among a plurality of tree structures in which an existence probability of each code is differently assigned to each node, based on a context of previous symbols;
detecting a probability value corresponding to each code of the detected codeword based on the selected tree structure;
calculating a difference between a representative value indicated by the detected codeword and a value indicated by the specific symbol and calculating a probability of detecting the specific symbol from among symbols contained in the detected codeword; and
arithmetically encoding the detected codeword and the calculated difference using the calculated probabilities.

59. A computer-readable recording medium having embodied thereon a computer program to execute a method, wherein the method comprises:
detecting a codeword corresponding to a specific symbol from among stored codewords, each stored codeword corresponding to predetermined grouped symbols;
selecting a predetermined tree structure from among a plurality of different tree structures in which an existence probability of each code is assigned to each node, based on a context of previous symbols;
detecting a probability value corresponding to each code of the detected codeword based on the selected tree structure;
calculating a difference between a representative value indicated by the detected codeword and a value indicated by the specific symbol and calculating a probability of detecting the specific symbol from among symbols contained in the detected codeword; and
arithmetically encoding the detected codeword and the calculated difference using the calculated probabilities.

60. A computer-readable recording medium having embodied thereon a computer program to execute a method, wherein the method comprises:
detecting a codeword by performing arithmetic-decoding based on a tree structure in which an existence probability of each code is assigned to each node;
detecting a difference between a representative value indicated by the detected codeword and a value indicated by a symbol specified in an encoding end by performing arithmetic-decoding; and
detecting the specified symbol from among symbols grouped corresponding to the detected codeword using the detected difference.

61. A computer-readable recording medium having embodied thereon a computer program to execute a method, wherein the method comprises:
determining a tree structure used in an encoding end from among a plurality of tree structures in which an existence probability of each code is differently assigned to each node;
detecting a codeword by arithmetic-decoding a bitstream based on the determined tree structure;
detecting a difference between a representative value indicated by the detected codeword and a value indicated by a symbol specified in an encoding end by performing arithmetic-decoding; and
detecting the specified symbol from among symbols grouped corresponding to the detected codeword using the detected difference.

62. A computer-readable recording medium having embodied thereon a computer program to execute a method, wherein the method comprises:
determining a tree structure used in an encoding end from among a plurality of different tree structures in which an existence probability of each code is assigned to each node;
detecting a codeword by arithmetic-decoding a bitstream based on the determined tree structure;
detecting a difference between a representative value indicated by the detected codeword and a value indicated by a symbol specified in an encoding end by performing arithmetic-decoding; and detecting the specified symbol from among symbols grouped corresponding to the detected codeword using the detected difference.

63. An entropy encoding apparatus, comprising:

a codeword detector to detect a codeword corresponding to a respective symbol from one or more stored codewords, each stored codeword corresponding to predetermined grouped symbols; and a probability detector to detect a probability value corresponding to each code of the detected codeword based on at least one predetermined tree structure in which an existence probability of each code is assigned to each node.

64. The apparatus of claim 63, further comprising:

a selector to select the predetermined tree structure from a plurality of predetermined tree structures based on a context of previous symbols.

65. The apparatus of claim 63, further comprising:

a difference calculator to calculate a difference between a representative value indicated by the detected codeword and a value indicated by the respective symbol and to calculate a probability of detecting the respective symbol from one or more symbols contained in the detected codeword; and an arithmetic encoder to arithmetically encode the detected codeword and the calculated difference using the calculated probabilities.

66. An entropy decoding apparatus, comprising:

a tree structure determiner to determine a tree structure used to encode a signal from one or more tree structures in which an existence probability of each code is differently assigned to each node; and a codeword detector to detect a codeword by arithmetic-decoding a bitstream based on the determined tree structure.

67. The apparatus of claim 66, further comprising:

a difference detector to detect a difference between a representative value indicated by the detected codeword and a value indicated by a respective symbol used to encode the signal by performing arithmetic-decoding; and a symbol detector to detect the specified symbol from one or more symbols grouped corresponding to the detected codeword using the detected difference.

68. A method of encoding a signal, the method comprising:

detecting a codeword corresponding to a respective symbol from one or more stored codewords in which each stored codeword corresponds to predetermined grouped symbols; and detecting a probability value corresponding to each code of the detected codeword based on at least one predetermined tree structure in which an existence probability of each code is assigned to each node.

69. A method of decoding a signal, the method comprising:

determining a tree structure used to encode a signal from one or more tree structures in which an existence probability of each code is differently assigned to each node; and detecting a codeword by arithmetic-decoding a bitstream based on the determined tree structure.

* * * * *